United States Patent
Chowdhury et al.

(10) Patent No.: US 11,577,946 B2
(45) Date of Patent: Feb. 14, 2023

(54) FAIL-SAFE PNEUMATIC LIFT SYSTEM

(71) Applicant: Applied Materials, Inc., Santa Clara, CA (US)

(72) Inventors: Abhishek Chowdhury, Bangalore (IN); Kevin Griffin, Livermore, CA (US); Kenneth Brian Doering, San Jose, CA (US); Santhoshkumar Doddegowdanapalya Nanjundegowda, Karnataka (IN); Somashekhar Kosthi, Karnataka (IN); Abhijit Ghosh, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 409 days.

(21) Appl. No.: 16/988,647

(22) Filed: Aug. 8, 2020

(65) Prior Publication Data
US 2022/0041413 A1    Feb. 10, 2022

(51) Int. Cl.
| | |
|---|---|
| *B66F 3/00* | (2006.01) |
| *B66F 3/30* | (2006.01) |
| *B66F 17/00* | (2006.01) |
| *B66F 3/24* | (2006.01) |

(52) U.S. Cl.
CPC ............ *B66F 3/30* (2013.01); *B66F 3/247* (2013.01); *B66F 17/00* (2013.01)

(58) Field of Classification Search
CPC ...... B66F 3/30; B66F 3/00; B66F 5/00; B66F 11/00; B66F 2700/00; B66F 2700/05
See application file for complete search history.

(56) References Cited

U.S. PATENT DOCUMENTS

| | | | |
|---|---|---|---|
| 4,807,427 A * | 2/1989 | Casteel | B65B 11/006 53/389.2 |
| 4,852,659 A | 8/1989 | Ross et al. | |
| 5,148,651 A | 9/1992 | Masuda et al. | |
| 5,463,841 A * | 11/1995 | Hayakawa | B65B 69/0033 53/381.2 |
| 5,752,729 A | 5/1998 | Crozier et al. | |
| 5,893,258 A * | 4/1999 | Lancaster, III | B65B 11/045 53/529 |
| 2022/0041413 A1 * | 2/2022 | Chowdhury | B66C 17/06 |

FOREIGN PATENT DOCUMENTS

| | | |
|---|---|---|
| KR | 101762570 B1 | 7/2017 |
| KR | 101823049 B1 | 3/2018 |

OTHER PUBLICATIONS

PCT International Search Report and Written Opinion in PCT/US2021/044706 dated Nov. 8, 2021, 8 pages.

\* cited by examiner

*Primary Examiner* — Lee D Wilson
(74) *Attorney, Agent, or Firm* — Servilla Whitney LLC

(57) ABSTRACT

Apparatus and methods for lifting loads are described. The load lift includes a support frame and a lift assembly with main cylinder and at least one standby cylinder connecting a rotatable cross beam with a clamp plate. A rotary actuator assembly is connected to the lift beam to move the lift assembly out of the way while not in use by rotating the lift assembly from a lift position to a standby position.

20 Claims, 19 Drawing Sheets

FAIL-SAFE PNEUMATIC LIFT SYSTEM

TECHNICAL FIELD

Embodiments of the disclosure generally relate to apparatus for lifting heavy objects. In particular, embodiments of the disclosure relate to pneumatic lift systems to safely move heavy process chamber components.

BACKGROUND

The need to lift heavy components is common in many manufacturing and service environments. In semiconductor manufacturing, process chamber components (e.g., lids) often need to be removed from the process chamber to allow for an operator to perform routine maintenance as well as repairs and upgrades. Outside the semiconductor manufacturing environment, very heavy loads (e.g., automobile engines) are frequently lifted for any number of reasons.

Currently, heavy components are typically lifted using electric winches and chains to lift process chamber parts or gantry girders. Winches and chains can fail under heavy stress conditions, resulting in loss of the load. A heavy load dropping from any height can damage the load or injure nearby personnel.

Therefore, there is a need for fail-safe apparatus to lift heavy components.

SUMMARY

One or more embodiments of the disclosure are directed to load lifts comprising a support frame and a lift assembly. The support frame has uprights and a cross beam. The uprights extend along a first direction and are connected together by a cross beam extending along a second direction. The lift assembly comprises a lift beam with a lift beam axis that extends along the second direction. The lift beam is connected to the cross beam and is configured to rotate around the lift beam axis between a lift position and a standby position. The lift assembly includes a main cylinder with a first end and a second end. The first end of the main cylinder is connected to the lift beam. The lift assembly includes at least one standby cylinder with a first end a second end. The first end of the at least one standby cylinder is connected to the lift beam. A clamp plate is connected to the second end of the main cylinder and the second end of the at least one standby cylinder.

Additional embodiments of the disclosure are directed to methods of moving a load. The load is lowered by actuating a lift assembly having a lift beam that is connected to a clamp plate through a main cylinder and at least one standby cylinder. The load is connected to the clamp plate. The load is disconnected from the clamp plate after lowering and the lift assembly is rotated around an axis of the lift beam to a standby position.

Further embodiments of the disclosure are directed to load lifts comprising a support frame and a lift assembly. The support frame has uprights and a cross beam. The uprights extend along a first direction and are connected together by the cross beam extending along a second direction. The lift assembly comprises a lift beam, a main cylinder, two standby cylinders, a clamp plate and a spreader bar. The lift beam has a lift beam axis that extends along the second direction. The lift beam is connected to the cross beam and is configured to rotate around the lift beam axis between a lift position and a standby position. The main cylinder has a first end and a second end with the first end connected to the lift beam. The two standby cylinders are positioned on opposing sides of the main cylinder. Each of the standby cylinders has a first end a second end with the first end connected to the lift beam. The clamp plate has a top surface and a bottom surface. The top surface is connected to the second end of the main cylinder and the second end of the at least one standby cylinder. The bottom surface is connected to a ball joint. The spreader bar is connected to the ball joint of the clamp plate and is configured to cooperatively interact with a process chamber dome. A rotary actuator assembly is connected to the lift beam and comprises a mounting bracket, a floating bracket and a rotary cylinder. The mounting bracket is fixedly secured to the cross beam. The floating bracket is connected to the mounting bracket with a hinged connection. The rotary cylinder is connected to the floating bracket and the lift beam so that a piston rod is connected to the lift beam, and is configured so that movement of a piston rod from the rotary cylinder causes the lift beam to rotate around the lift beam axis from the standby position to the lift position.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
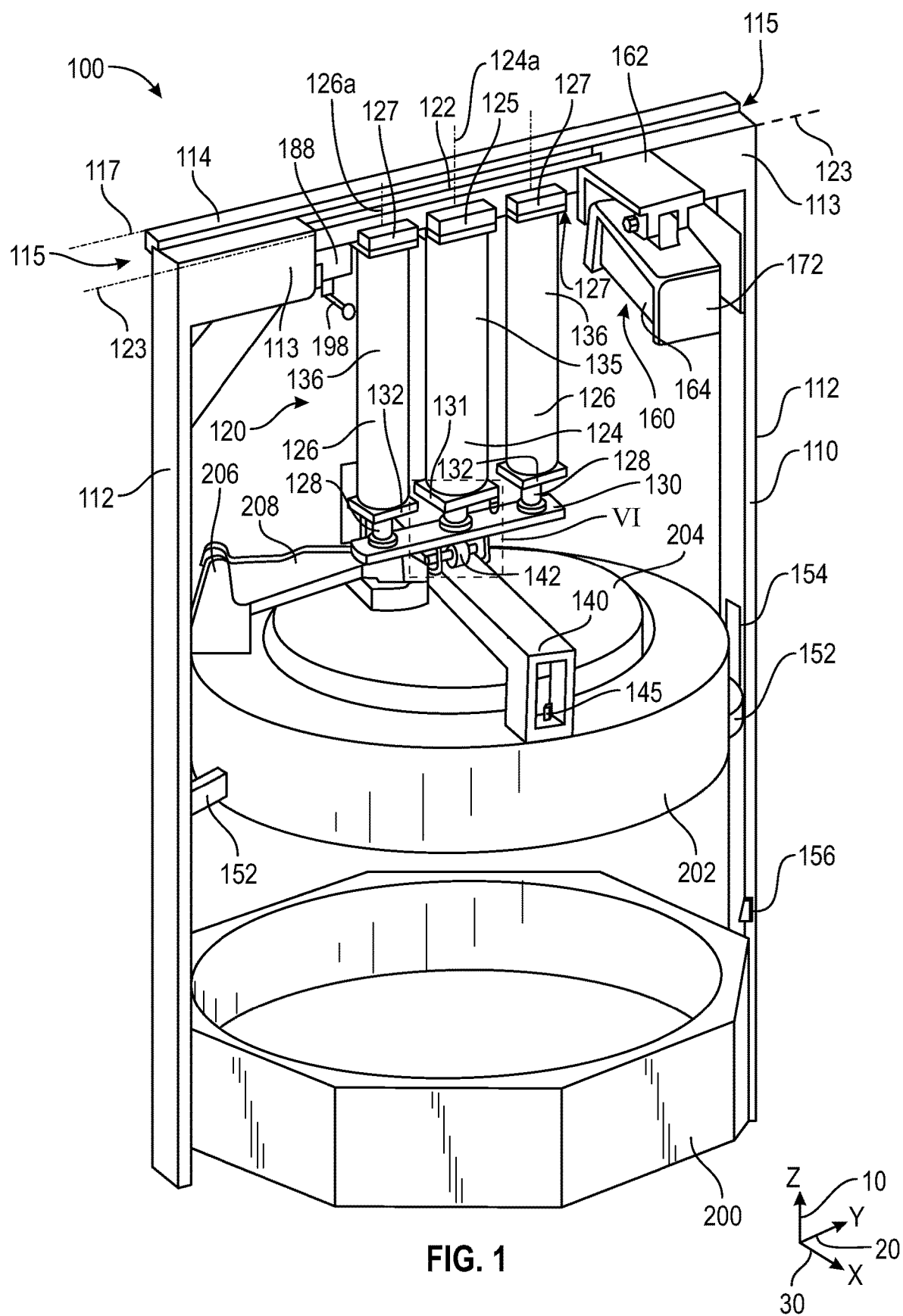
FIG. 1 is a parallel projection view of a load lift supporting a process chamber lid according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon One or more embodiments of the disclosure provide failsafe lifting systems which are capable of holding loads on loss of air pressure or electricity or due to a malfunction of one or more of the lift cylinders. The mechanism of some embodiments provides non-bending loads on the cylinders. Some embodiments of the mechanism handle materials with an offset center of gravity.

One or more embodiments of the disclosure provide rotation and linkage mechanisms which allow for servicing a processing chamber without removing the cylinders from their m mounting points. One or more embodiments of the disclosure eliminate requirements for requalification of load testing between uses. Some embodiments are self-aligning and reduce rotational forces, thereby providing lift system flexibility when attaching a load.

Embodiments of the disclosure provide mechanisms that allow the lifting of heavy processing chamber parts, allowing process chamber components to be more easily serviced.

Some embodiments provide lift systems that can be rotated out of the chamber service area without un-mounted the lift system to the chamber frame. By keeping the lift system connected to the chamber frame it may be possible to reuse the pneumatic lift during the next servicing without having to re-perform load tests. This advantageously saves critical time and manufacturing costs.

One or more embodiments of the disclosure provide safe rigid lifting mechanisms as compared to electrical wenches. One or more embodiments of the disclosure provide features to make final alignments of heavy parts easy during disassembly and assembly of the processing chamber. Some embodiments include built in self-aligning features to handle center of gravity offset loads, allowing for the lifting of extremely heavy loads over a large cylinder stroke without bending or jamming the pneumatic cylinders.

One or more embodiments of the disclosure provide fail-safe lift systems in which one or more standby pneumatic cylinder works in conjunction with a main lift cylinder. In some embodiments, two standby pneumatic cylinders are positioned on opposing sides of a main pneumatic lift cylinder. The standby pneumatic cylinders act as redundant fail-safe supports in case the main cylinder fails to function properly.

In some embodiments, an advanced pneumatic control mechanism enables the lift system to hold the load firmly in position at any span of the actuator's stroke in the event of pressure loss or power failure. In some embodiments, the whole mass of the load is connected to actuators by a spreader bar through a ball joint or end eye bolt to enable the actuators to take the load at a slight offset to the center of gravity of the load (e.g., a process chamber dome assembly). In one or more embodiments, lateral load stresses to the actuator piston rods are avoided and the slight variation in travel rates of the pistons among different cylinders.

The pneumatic cylinders guide the piston vertically along the axes of the bore, preventing potential wobbling, fluctuations and drooping of the done assembly while lifting.

In some embodiments, kinematic push cylinder pushes the lift actuator assembly out of the way during servicing the chamber in the lid hinged condition. The lift assembly moving out of the way allows for servicing the components needing to remove components or work in awkward spaces.

The rotary cylinder assembly of some embodiments is further fail-safed by inclusion of a hard stop lock. This allows the lifting torque available from the push cylinder to increase gradually with an increase in its stroke.

Figure 2:
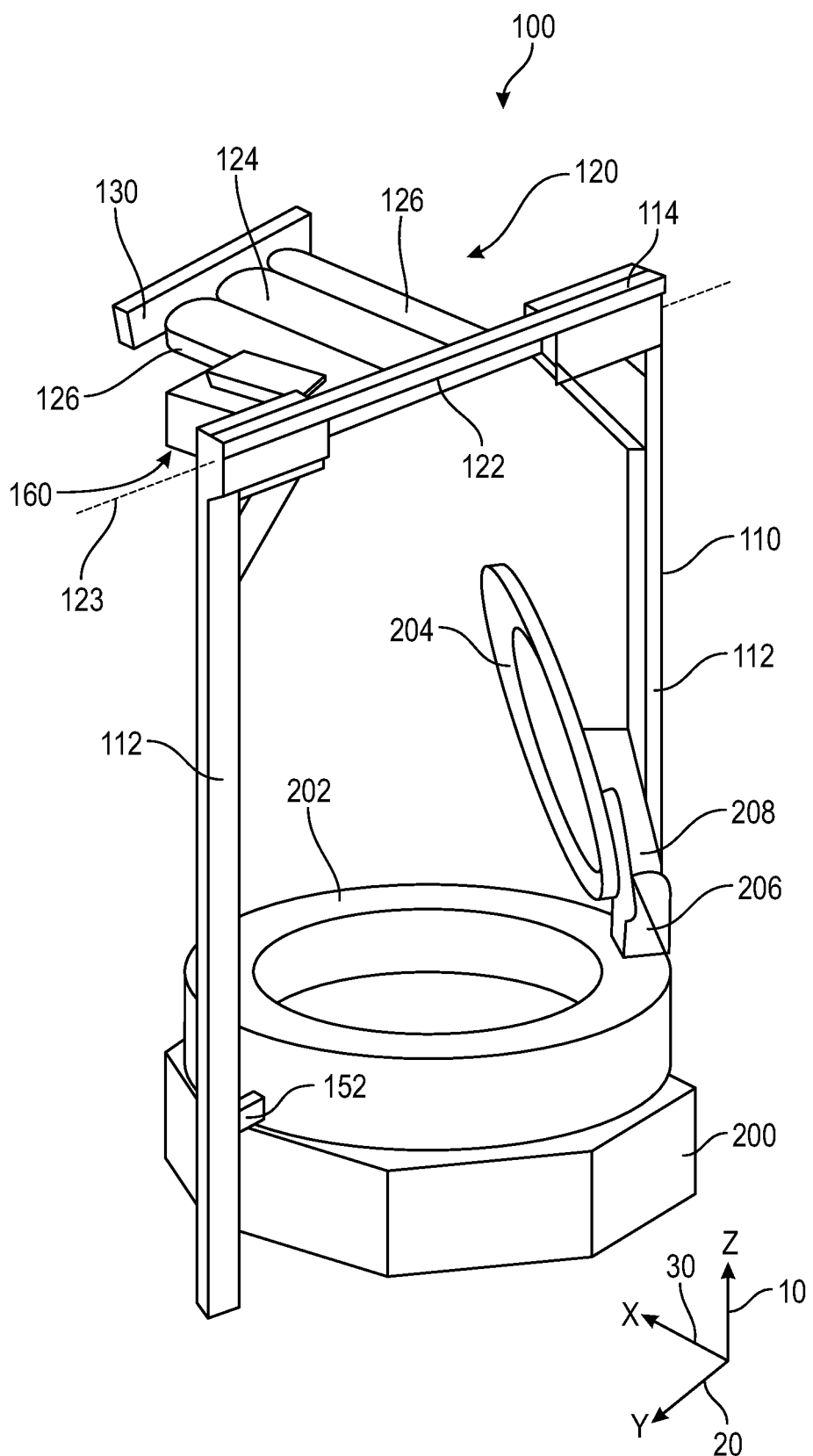
FIG. 2 is a parallel projection view of a load lift in the standby position according to one or more embodiment of the disclosure.

FIGS. 1 and 2 illustrate an exemplary load lift system 100 according to one or more embodiments of the disclosure. FIG. 1 shows the load lift system 100 positioned on a processing chamber 200 supporting the chamber dome 202 using a plurality of pneumatic cylinders in a pneumatic lift assembly. The embodiment illustrated in FIG. 1 shows the chamber dome 202 of the processing chamber 200 in the lifted position.

FIG. 2 shows the reverse angle of the load lift system 100 with the dome 202 in the process position. The lid 204 on top of the dome 202 is in the open position on hinge 206 and hinge arm 208. The load lift system 100 in FIG. 2 is shown in the standby configuration.

Figure 3:
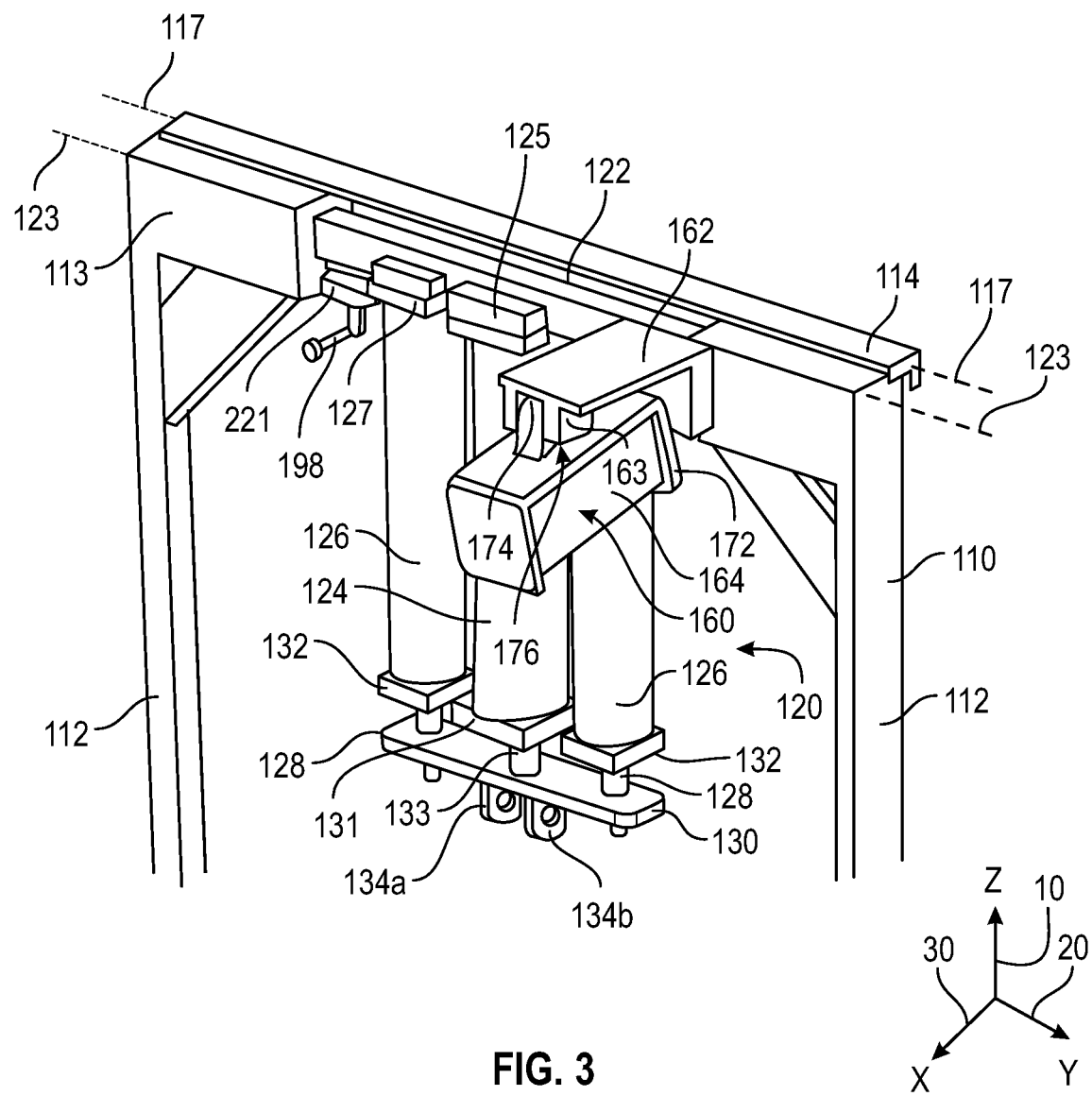
FIG. 3 is an isometric view of a load lift in the lift position according to one or more embodiment of the disclosure.
Figure 4:
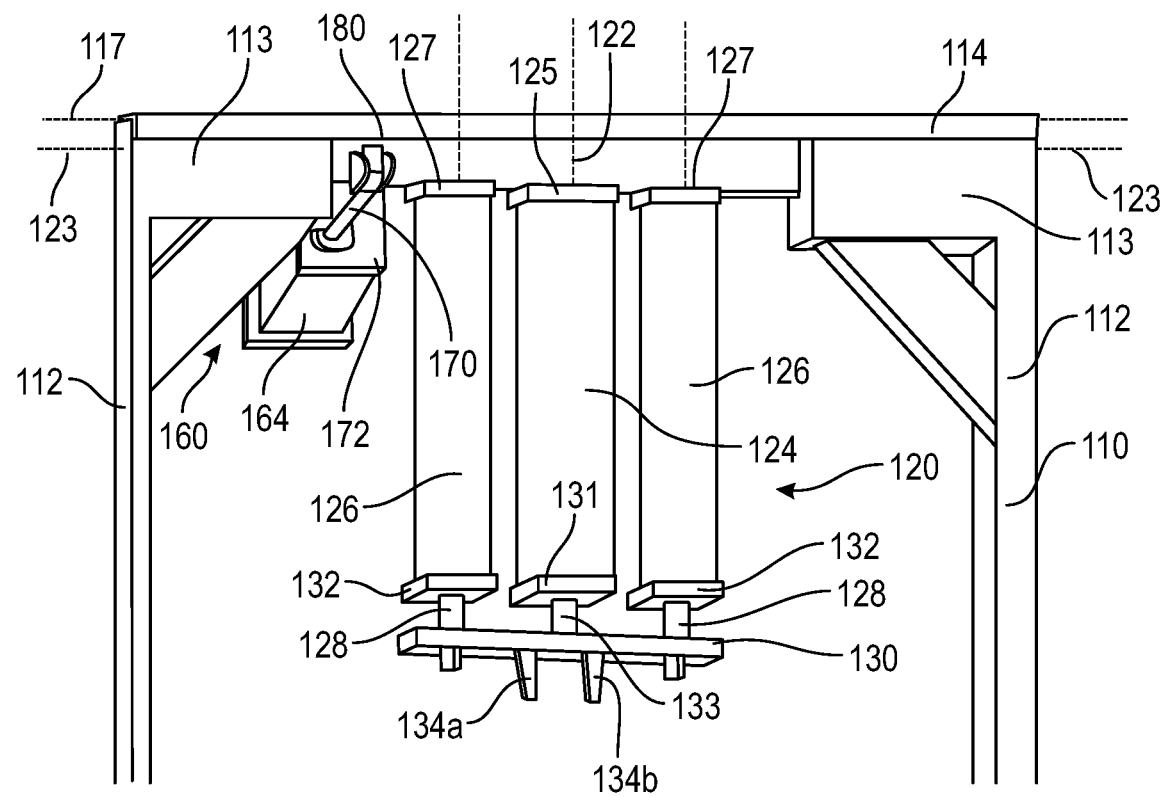
FIG. 4 is a parallel projection view of a load lift in the lift position according to one or more embodiment of the disclosure.
Figure 5:
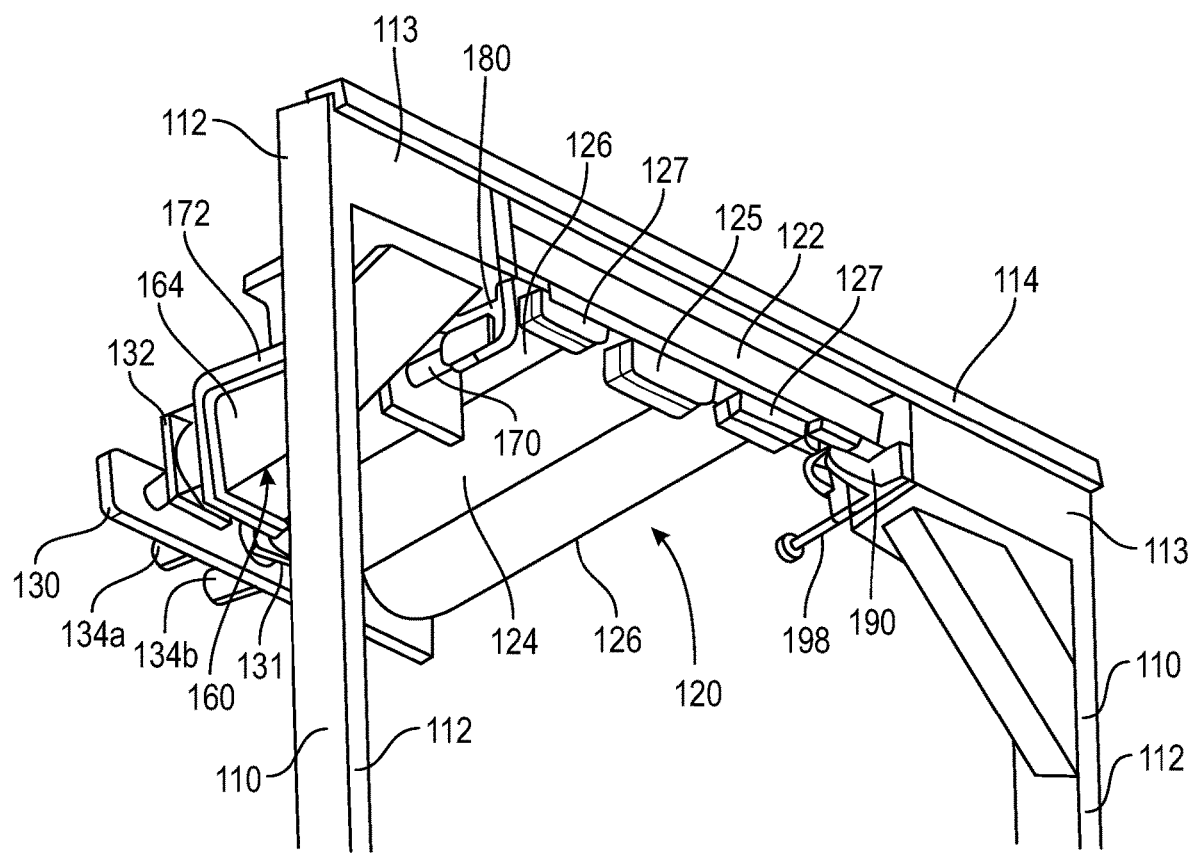
FIG. 5 is an isometric view of a load lift in the standby position according to one or more embodiment of the disclosure.

Referring to FIGS. 1 through 5, one or more embodiments of the disclosure is directed to load lifts 100 comprising a support frame 110. The processing chamber dome 202 assembly rides along the support frame 110 of the load lift system 100 and is connected to the lift assembly 120 through a spreader bar 140. A pneumatic push cylinder (also referred to as a rotary actuator 160) is connected to the pneumatic lift assembly 120 to allow for the pneumatic lift assembly 120 to be pushed aside, as shown in FIGS. 2 and 5.

The support frame 110 illustrated has uprights 112 and a cross beam 114. In use, the uprights 112 are generally oriented vertically. As used in this manner, the term "vertically" means parallel (±5°) to the pull of gravity. In some embodiments, the uprights 112 extend in a first direction 10 which is also referred to as the Z-axis direction.

The cross beam 114 extends along a second direction 20, also referred to as the Y-axis direction. The cross beam 114 extends along axis 117 which extends along the second direction 20. In use, the support frame 110 has the cross beam 114 horizontally connecting the uprights 112. As used in this manner, the term "horizontally" means perpendicular (±5°) to the pull of gravity. The cross beam 114 of some embodiments connects the uprights 112 of the support frame 110 forming a rigid structure. The second direction 20 of some embodiments is perpendicular to (±5°) the first direction 10.

In the embodiment illustrated in the Figures, the upright 112 has an upper portion 113 that extends a distance along the second direction 20. The cross beam 114 forms an intersection 115 with the uprights 112 at the upper portion 113. The skilled artisan will recognize that the embodiment illustrated is merely representative of one possible configuration and should not be taken as limiting the scope of the disclosure.

In some embodiments, the first direction 10 is at an angle greater than 5° from the direction of the pull of gravity resulting in a support frame 110 with uprights 112 resembling splayed legs. In some embodiments with splayed legs, the cross beam 114 forms an angle at the intersections with each upright 112. In some embodiments, the angles at the intersections between the cross beam 114 and the uprights 112 are symmetrical. In some embodiments, the angles at the intersections between the cross beam 114 and the uprights 112 are asymmetrical.

The lift assembly 120 has a lift beam 122 that extends along the second direction 20. The lift beam 122 has an axis 123 (shown in FIG. 1) that extends along the second direction 20. In some embodiments, the axis 123 is offset from the axis 117 of the cross beam 114 of the support frame 110. In the embodiment illustrated in the Figures, the lift beam 122 extends between the upper portions 113 of the uprights 112 and is offset from the cross beam 114. The axes for the cross beam and the lift beam are considered to be extending along the center of mass of the component along the length of the component. For example, the cross beam 114 illustrated is a L-shaped component and the axis 117 extends through the theoretical center of mass of the component which may not pass through the component physically.

FIGS. 3 and 4 show expanded views of the lift assembly 120 from one side of the load lift system 100. FIG. 5 shows an expanded view of the lift assembly 120 from the other side of the load lift system 100. For descriptive purposes only, the side illustrated in FIGS. 1, 3 and 4 may be referred to as the back side and the side illustrated in FIGS. 2 and 5 may be referred to as the front side. The lift beam of some embodiments is connected to the cross beam and is configured to rotate around the lift beam axis between a lift position (as shown in FIG. 1) and a standby position (as shown in FIG. 2).

In some embodiments, the lift assembly 120 includes standby cylinders 126 on either side of the main lift cylinder 124. The standby cylinders 126 of some embodiment act as a secondary fail safe support in case the main cylinder 124 fails to function. In some embodiments, an advanced pneumatic control mechanism enables the lift assembly 120 to hold the load firm in position at any span of the actuators stroke in case of pressure loss and/or power failure.

The lift assembly 120 includes a main cylinder 124 with a first end 125 and a second end 131. The first end 125 of the main cylinder 124 is connected to the lift beam 122. The first end 125 of the main cylinder 124 is connected to the lift beam 122 by any suitable connection or fastener known to the skilled artisan. In some embodiments, the fastener is a locking fastener that resists loosening.

The main cylinder 124 of some embodiments is a pneumatic cylinder connected to a gas source (not shown). The main cylinder 124 of some embodiments is a single acting cylinder. The main cylinder 124 of some embodiments is a double acting cylinder.

The main cylinder 124 illustrated has a piston rod 133 that extends from within the cylinder body 135 between a retracted position (as shown in FIG. 1) and an extended position. In some embodiments, the piston rod 133 extends from the second end 131 of the main cylinder 124 so that the body 135 of the main cylinder 124 remains in a fixed position relative to the lift beam 122. In some embodiments, the piston rod 133 extends from the first end 125 of the main cylinder 124 so that the body 135 of the main cylinder moves closer to and further from the lift beam 122 during actuation of the main cylinder 124.

The lift assembly includes at least one standby cylinder 126. Each of the at least one standby cylinder 126 has a first end 127 connected to the lift beam 122 by any suitable connection or fastener known to the skilled artisan, and a second end 132. In some embodiments, there are two, three, four or more standby cylinders 126. In some embodiments, there are two standby cylinders 126. In some embodiments, the standby cylinders 126 are positioned on opposing sides of the main cylinder 124. For example, as shown in the Figures, the main cylinder 124 has a standby cylinder 126 on either side thereof so that a piston rod 133, 128 extending from the cylinders form a line.

The sizes of the main cylinder 124 and the at least one standby cylinder 126 can be the same or different. In some embodiments, the main cylinder 124 is a larger cylinder than the individual standby cylinders 126. In some embodiments, the main cylinder 124 is configured to move a greater mass than the individual standby cylinders 126. In some embodiments, the combined standby cylinders 126 are configured to move a greater mass than the main cylinder 124.

The standby cylinders 126 of some embodiments actuate along the axis (running between the first end and second end) of the prime actuator (main cylinder 124) which can take up the full load in case the prime actuator fails. In some embodiments, the prime actuator (main cylinder 124) is mounted so that the axis of the main cylinder 124 is aligned with the center of gravity of the mass of the dome assembly or load to be lifted and the standby actuators 126 are mounted symmetrically about the center of gravity line. The pneumatic cylinders guide the mass to be lifted along their axes. In some embodiments, the axes of the cylinders 124, 126 are aligned with the movement of the piston rods 133, 128 from within the respective body 135, 136 of the cylinder 124, 126.

In some embodiments, a clamp plate 130 is connected to the second end 131 of the main cylinder and the second end 132 of the at least one standby cylinder 126. In some embodiments, the second end 131 of the main cylinder 124 and the second end 132 of the standby cylinder 126 comprise a piston rod 133, 128 which can move into and out of the body 135, 136 of the cylinders at the second end. In the illustrated embodiment in which there are two standby cylinders 126 positioned on opposing sides of the main cylinder 124, all of the standby cylinders 126 and main cylinder 124 are connected to the same clamp plate 130.

In some embodiments, the entire mass of the item being supported (e.g., a process chamber lid) is connected to the actuators (cylinders) by a spreader bar 140. The spreader bar 140 of some embodiments is connected to the clamp plate 130 through a ball joint 142, which enables the actuators to take the load with slight offset in the center of gravity of the dome assembly.

Figure 6:
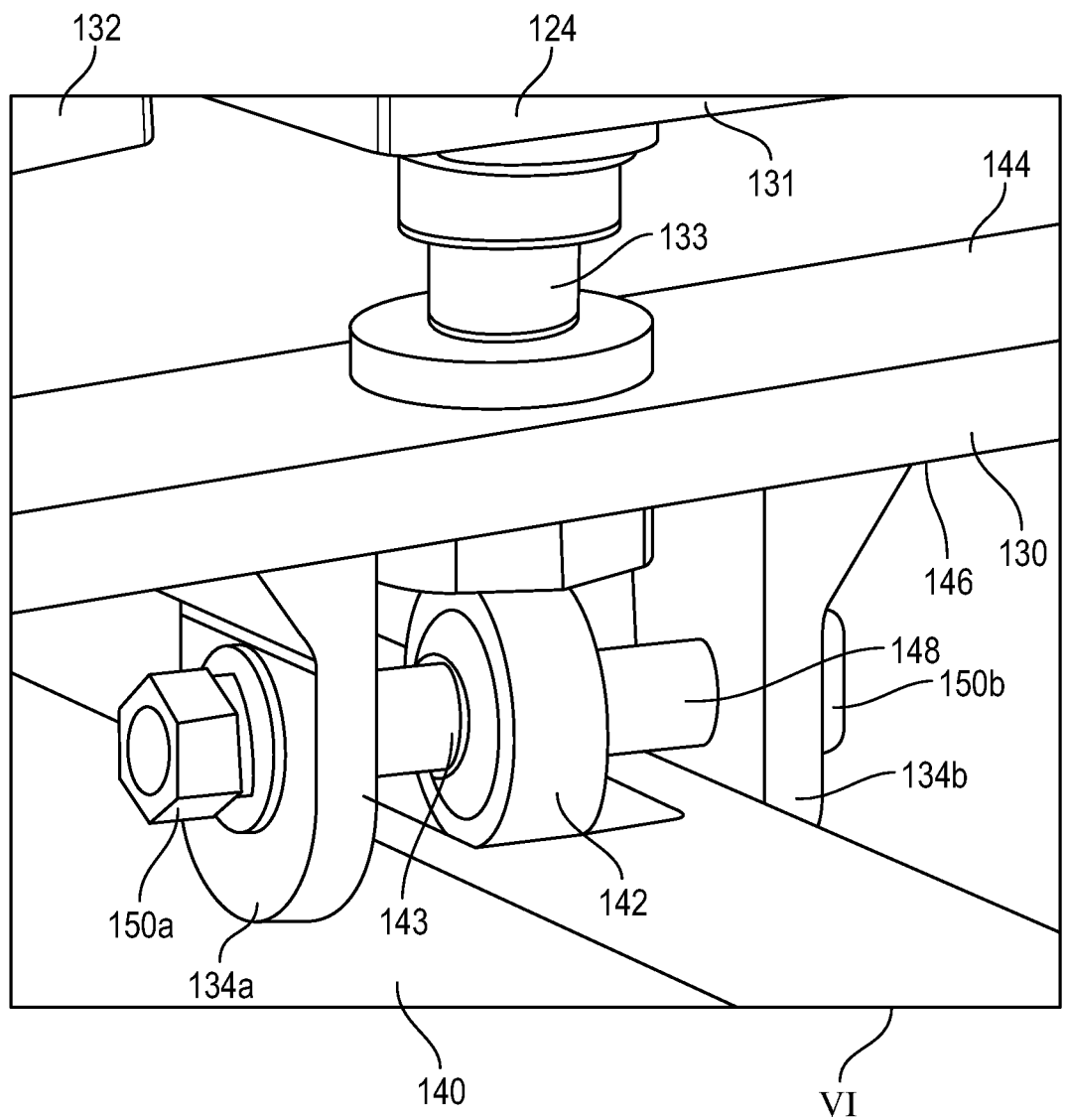
FIG. 6 is a parallel projection view of a portion of a load lift according to one or more embodiment of the disclosure.
Figure 7:
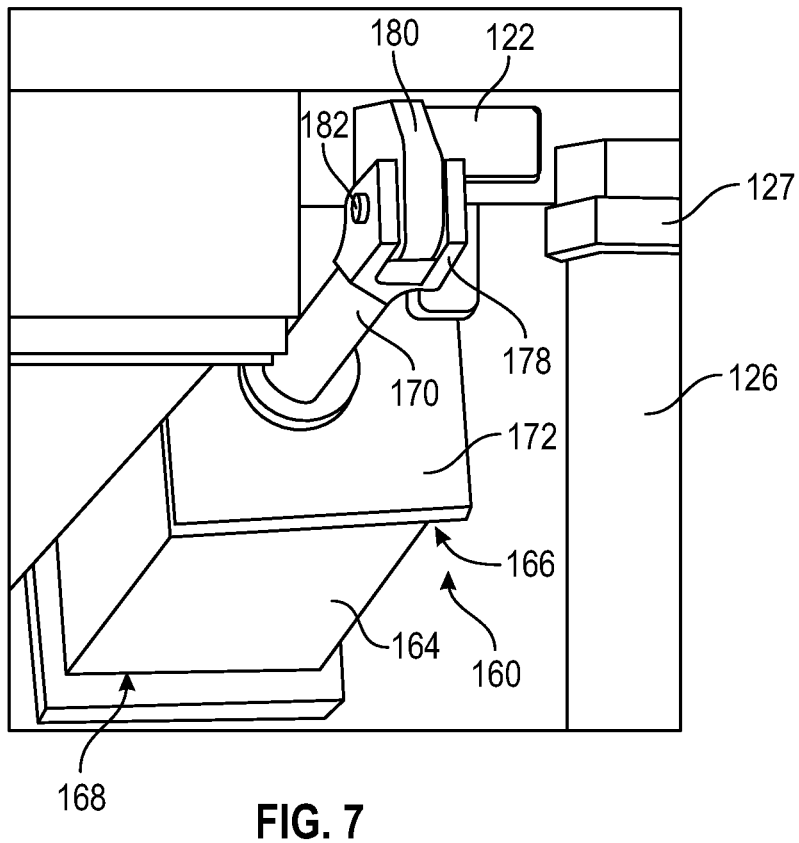
FIG. 7 is a parallel projection of a rotary cylinder portion of a load lift according to one or more embodiment of the disclosure.
Figure 8:
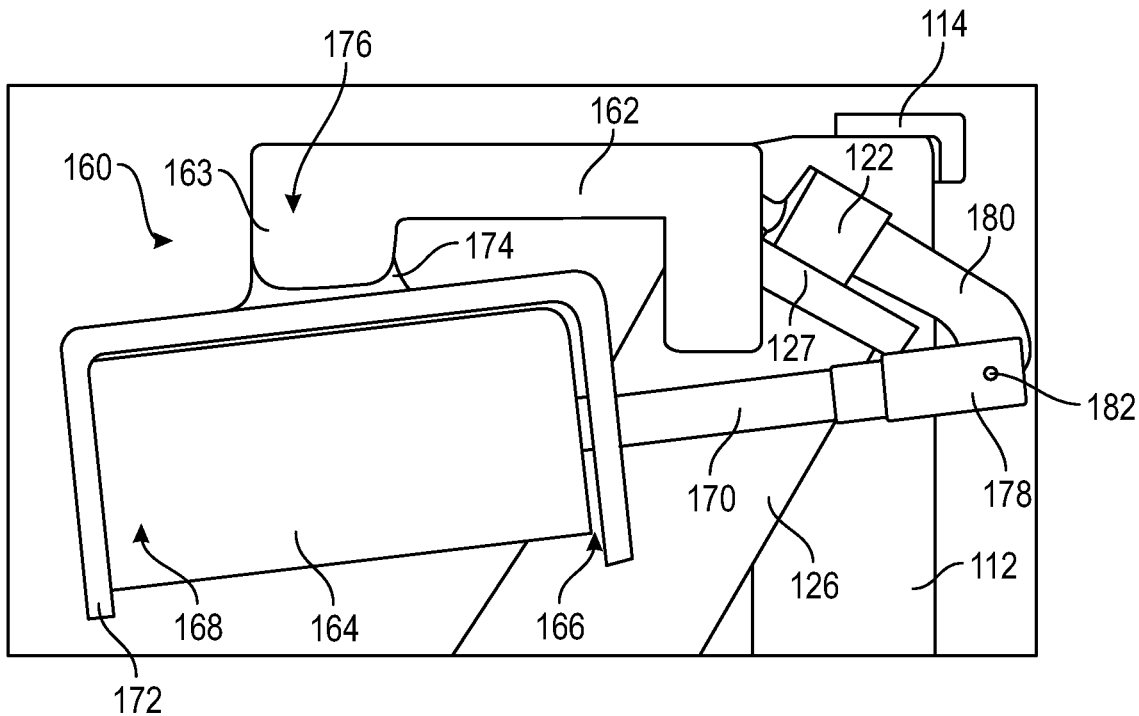
FIG. 8 is a side view of a rotary cylinder portion of a load lift according to one or more embodiment of the disclosure.

FIG. 6 shows an expanded view of region VI of FIG. 1. Referring to FIG. 6, in some embodiments, the mass (load) is connected to the lift assembly 120 through ball joint rod end ball joint 142. As it has flexibility to rotate through all degrees of freedom, which enables the actuators (cylinders 124, 126) to handle the load with slight offset in center of gravity of the dome assembly. This alignment prevents or minimizes the effects or issues associate with having a lateral load acting on the actuator piston rod. Additionally, the spreader bar 140 connecting to the lift assembly 120 using the through ball joint rod end ball joint 142 helps equalize slight variations in the rates of travel of cylinder pistons rods 133, 128. This allows the pneumatic cylinders to guide the piston vertically along the axes of the bore, overcoming issues associated with wobbling, fluctuation and drooping of the load (e.g., the dome assembly) while lifting.

In some embodiments, the spreader bar 140 connected to the clamp plate 130 is configured to cooperatively interact with a load. In the illustrated embodiments, the spreader bar 140 connected to the clamp plate 130 is configured to cooperatively interact with a process chamber dome. As used in this manner, the spreader bar 140 cooperatively interacts with the load means that the spreader bar 140 is connected to or affixed to the load. In some embodiments, the spreader bar 140 has a friction fit connection to the load. In some embodiments, the spreader bar 140 is affixed to the load using a fastener 145 (shown in FIG. 1). In some embodiments, the spreader bar 140 is integrally formed with the load.

In the embodiment illustrated in FIG. 6, the clamp plate 130 has a first side 144 and a second side 146 opposite the first side 144. The main cylinder 124 is connected to the first side 144 of the clamp plate 130 and a ball joint 142 is on a side of the clamp plate 130 opposite the main cylinder 124. The spreader bar 140 is connected to the ball joint 142 by any suitable connection known to the skilled artisan. In some embodiments, the ball joint 142 is bolted to the load through the spreader bar 140. In some embodiments, the ball joint 142 is an integral part of the spreader bar 140. In some embodiments, the main cylinder 124 is connected to the first side 144 of the clamp plate 130 using an eye bolt. The skilled artisan will recognize that eye bolts and the illustrated ball joint are merely representative examples of fasteners that can be used to connect the clamp plate and main cylinder and should not be taken as limiting the scope of the disclosure. The skilled artisan will recognize that other connection configurations can be employed and are within the scope of the disclosure.

Still referring to FIG. 6, in some embodiments, one or more flange 134a, 134b extend from the second side 146 of the clamp plate 130. In the illustrated embodiment there are two flanges 134a, 134b spaced a distance sufficient to allow the clamp plate 130 to be connected to the spreader bar 140. A support rod 148 in some embodiments extends through openings (not visible) in the flanges 134a, 134b and the opening 143 in the ball joint 142. The support rod 148 is affixed to the flanges 134a, 134b using bolts 150a, 150b. The skilled artisan will recognize that the embodiment illustrating the connection between the clamp plate 130 and the spreader bar 140 is merely exemplary and should not be taken as limiting the scope of the disclosure. The spreader bar 140 and clamp plate 130 can be connected by any suitable connection known to the skilled artisan. The embodiment illustrated is merely representative of one possible configuration and other connection configurations are within the scope of the disclosure. In some embodiments, the flanges extend further downwards, there is a hole in the spreader bar and corresponding holes in the flanges and a pin extends through the holes in the spreader bar and flanges without using an eye bolt.

Referring back to FIG. 1, during actuation of the lift assembly 120, the load (e.g., chamber dome 202) is lifted in the direction of the axis of the main cylinder 134. In some embodiments, the load is guided by the lift assembly 120 actuation only. In some embodiments, guides 152 extending from the load are aligned with channels 154 in the uprights 112 to prevent rotational movement of the load relative to the axis of the main cylinder 134. The guides 152 of some embodiments are moveable between a guiding position (as shown in FIG. 1) and non-guiding position. In some embodiments, the guides 152 are permanently affixed to the load and are positioned in the channel 154 in the uprights 112 through an opening 156 along the length of the channel 154.

In some embodiments, the lift assembly 120 interferes with the lid 204 of the processing chamber 200 at the hinged or open position while servicing the connected lines and components. A kinematic push cylinder mechanism, also referred to as a rotary actuator assembly 160 pushes aside the whole lift assembly 120 while servicing the chamber 200 in its lid hinged condition. FIG. 2 illustrates the processing chamber 200 showing the dome 202 with the lid 204 in the hinged condition. The lid 204 is lifted off of the dome 202 using the hinge 206 and hinge arm 208, and the lift assembly 120 is moved out of the way the of servicing space while chamber is being serviced.

Referring to FIGS. 7, 8 and 9A through 9C, in addition to FIGS. 1 through 5, the rotary actuator 160 is illustrated. The rotary actuator mounting bracket in the illustrated embodiment is hinged so that the lateral load which would have come on the piston rod is avoided.

In some embodiments, the rotary actuator assembly 160 is connected to one or more of the lift beam 122 or the cross beam 114. In some embodiments, the rotary actuator assembly is connected to the lift beam 122. In some embodiments, the rotary actuator assembly 160 comprises a mounting bracket 162 connected to the cross beam 114 or the upper portion 113 of the uprights 112, which can be considered part of the cross beam 114. In the embodiment illustrated in the Figures, the mounting bracket 162 is connected to the upper portion 113 of the uprights 112 and extends at an angle to the cross beam 114.

The rotary cylinder assembly 160 includes a rotary cylinder 164 with a first end 166 and a second end 168. The skilled artisan will recognize that the rotary cylinder 164 illustrated in the Figures has a rectangular cross-section. The term cylinder refers to a component that operates as a pneumatic cylinder and should not be taken as limiting the scope of the disclosure to cylindrical shaped components.

In the embodiments shown, the mounting bracket 162 is fixedly secured to the cross beam 114. A floating bracket 172 holds the rotary cylinder 164 at an angle to the lift beam 122. The floating bracket 172 has a floating bracket flange 174 which is connected to a hinge end 163 of the mounting bracket 162 to form a hinged connection 176 to the mounting bracket 162.

A piston rod 170 is extendable from the first end 166 of the rotary cylinder 164. The piston rod 170 has an actuator end 178 at the end of the piston rod 170 furthest from the rotary cylinder 164 when the piston rod 170 is extended. The actuator end 178 of some embodiments is connected to a lever arm 180 at hinge 182. The lever arm 180 is fixedly connected to the lift beam 122 so that movement of the piston rod 170 causes rotation of the lift assembly 120 around the axis 123 of the lift beam 122.

In some embodiments, the rotary cylinder assembly 160 is connected to the mounting bracket 162 and the lift beam 122 and configured so that movement of a piston rod from the rotary cylinder 164 causes the lift beam 122 to rotate around the lift beam axis 123.

Figure 9B:
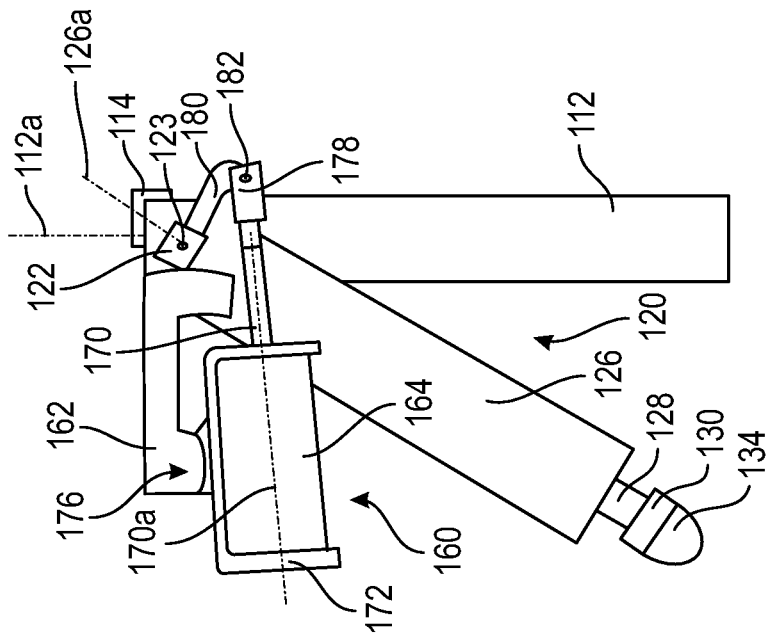
FIG. 9B is a side view of a rotary cylinder and lift assembly portion of a load lift in an intermediate position according to one or more embodiment of the disclosure.
Figure 9A:
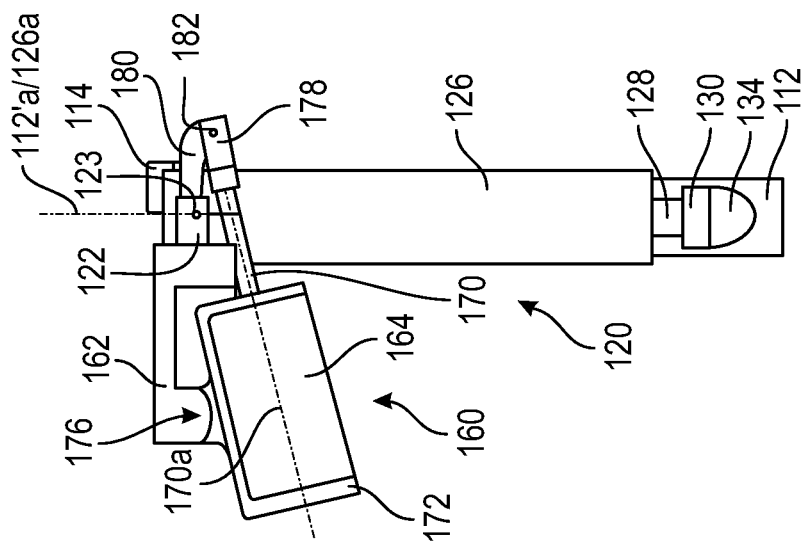
FIG. 9A is a side view of a rotary cylinder and lift assembly portion of a load lift in the lift position according to one or more embodiment of the disclosure.
Figure 9C:
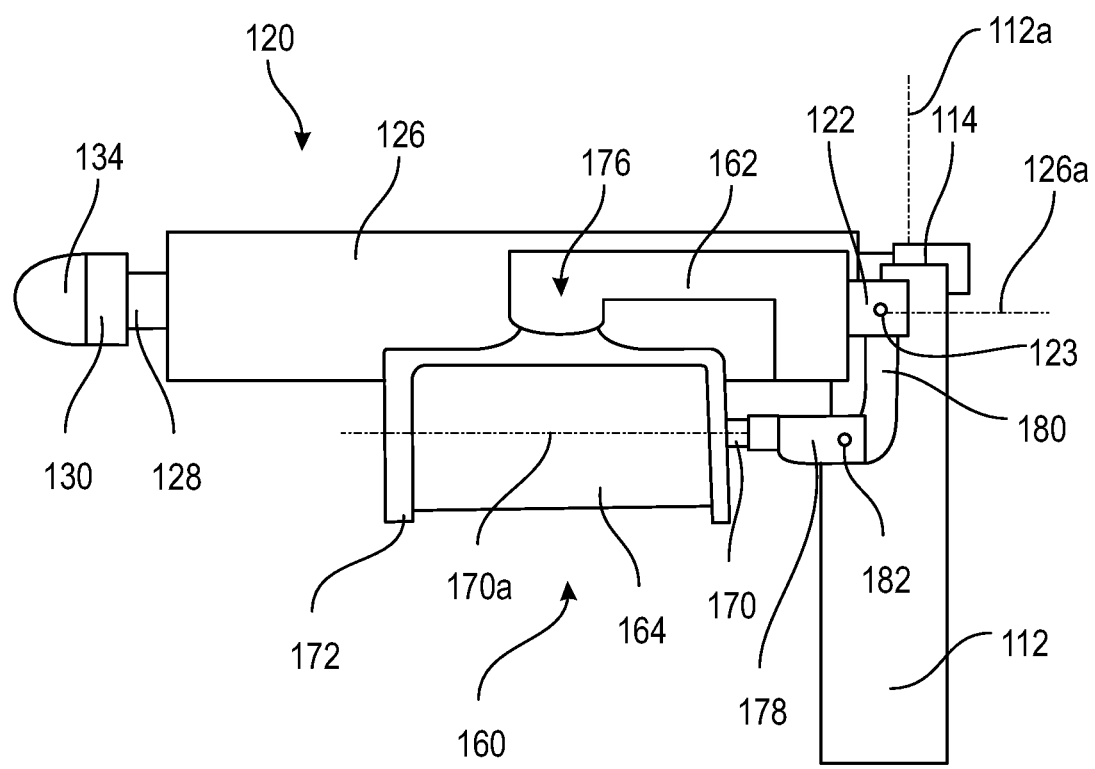
FIG. 9C is a side view of a rotary cylinder and lift assembly portion of a load lift in the standby position according to one or more embodiment of the disclosure.

The embodiment illustrated in FIGS. 9A through 9C show a view of the rotary cylinder assembly 160 looking along the lift beam axis 123. Stated differently, the lift beam axis 123 extends normal to the plane of the page. While only one standby cylinder 126 is visible in FIGS. 9A through 9C, the skilled artisan will recognize that the main cylinder 124 and optionally an additional standby cylinder 126 may be behind the visible standby cylinder 126.

FIGS. 9A through 9C illustrate the progression of the lift assembly 120 from the lift position (as shown in FIG. 9A) to the standby position (as shown in FIG. 9C). In the illustrated embodiment, the rotary cylinder 164 is on an opposite side of the lift beam 122 from the lever arm 180 so that retraction of the piston rod 170 into the rotary cylinder 164 moves the lift assembly from the lift position to the standby position. In some embodiments, the rotary cylinder 164 is on the same side of the lift beam 122 as the lever arm 180 so that retraction of the piston rod 170 into the rotary cylinder 164 moves the lift assembly 120 from the standby position to the lift position.

In the illustrated embodiment, the piston rod 170 is extended from the rotary cylinder 164 to a first end of the stroke of the piston rod 170. In some embodiments, the maximum amount of the piston rod 170 that can extend from the rotary cylinder 164 is sufficient to move the lift assembly 120 into the lift position. In some embodiments, the piston rod 170 extends a minimum distance from the rotary cylinder 164 when the lift assembly 120 is in the standby position. In some embodiments, when in one or more of the lift position or standby position, the piston rod 170 is extended between the minimum and maximum distances. In some embodiments, in the lift position, the piston rod extends from the rotary cylinder 164 by greater than or equal to 2 mm, 5 mm, 10 mm, 15, mm or 20 mm less than maximum extension. In some embodiments, in the standby position, the piston rod 170 extends from the rotary cylinder 164 by greater than or equal to 5 mm, 10 mm, 15 mm or 20 mm greater than the minimum distance.

In one or more embodiments, when the piston rod 170 of the rotary cylinder 164 is extended from the rotary cylinder 164, the lift beam 122 is in the lift position and when the piston rod 170 of the rotary cylinder 164 is retracted, the lift beam 122 is in the standby position. In some embodiments, the piston rod 170 of the rotary cylinder 164 extends from the first end 166 of the rotary cylinder 164 by an amount ranging from a minimum amount to a maximum amount so that at the minimum amount, the lift assembly 120 is in the standby position and in the maximum amount, the lift assembly 120 is in the lift position. The skilled artisan will understand that the length of the piston rod determines the available stroke and that shorter strokes require higher force. In some embodiments, the arrangement of the rotary cylinder helps to utilize the maximum amount of available cylinder force, minimizing the stroke and reducing the size of the piston and the cylinder.

In some embodiments, the mounting bracket 162 is fixedly secured to the cross beam 114 or upper portion 113 of the uprights 112. The term "fixedly secured" means that the connection between the stated components remains static throughout movement of the lift assembly 120 between the lift position and the standby position. In some embodiments, the floating bracket 172 holds the rotary cylinder 164 and is hingedly connected to the mounting bracket 162. The term "hingedly connected", and the like, means that the connection between the stated components is dynamic and changes between the lift position and the standby position.

The embodiments illustrated in FIGS. 9A through 9D are viewed along the lift beam axis 123. Stated differently, the lift beam axis 123 extends perpendicular to the plane of the page of the illustrations. FIG. 9A shows the lift assembly 120 in the lift position. In some embodiments, when the piston rod 170 of the rotary cylinder 164 is extended and the lift assembly 120 is in the lift position, the floating bracket 172 rests at an oblique angle relative to the lift beam axis 123, the upright axis 112a, the main cylinder axis, and the standby cylinder axis 126a. The angle of the floating bracket is measured based on the center line 170a or axis of the piston rod 170 of the rotary cylinder 164, as shown in FIG. 9A. In some embodiments, in the lift position, the angle offset of the center line 170a of the piston rod 170 to the lift beam axis 123 is in the range of 10° to 30°, or in the range of 15° to 25° off from parallel. In some embodiments, in the lift position, the angle offset of the center line 170a of the piston rod 170 from perpendicular to the upright axis 112a is in the range of 100° to 120°, or in the range of 105° to 115°. In some embodiments, in the lift position, the angle offset of the center line 170a to the standby cylinder axis 126a is in the range of 100° to 120°, or in the range of 105° to 115°.

FIG. 9C shows the lift assembly 120 in the standby position. In some embodiments, when the piston rod 170 of the rotary cylinder 164 is retracted and the lift assembly 120 is in the standby position, the floating bracket 172 (measured as the center line 170a of the piston rod 170) rests at an angle offset from parallel to the standby cylinder axis 126a (or main cylinder axis) in the range of 0° (parallel) to 5°. In some embodiments, when the piston rod 170 of the rotary cylinder 164 is retracted and the lift assembly 120 is in the standby position, the floating bracket 172 (measured as the center line 170a of the piston rod 170) rests at an angle in the range of 85° to 95°, or in the range of 88° to 92° relative to the upright axis 112a.

FIG. 9B illustrates the lift assembly 120 in a position between the lift position of FIG. 9A and the standby position of FIG. 9C. In the intermediate position, the angle of the floating bracket 172 (measured as the center line 170a of the piston rod) 170 is at an angle between the angles at the standby position and lifting position. The embodiments have been described and illustrated with the lift assembly 120 in the lift position when the piston rod 170 is extended and in the standby position when the piston rod 170 is retracted into the rotary cylinder 164. However, the skilled artisan will recognize that the arrangement of the connection between the rotary cylinder 164 and the lever arm 180 can be changed so that the lift assembly 120 is in the lift position when the piston rod 170 is retracted and in the standby position when the piston rod 170 is extended. When arranged in the reversed (relative to the drawings) configuration, the angles of the center line 170a of the piston rod 170 relative to the upright axis 112a, standby cylinder axis 126a, main cylinder axis 124a and/or lift beam axis 123 are reversed from the angles described above.

Movement of the floating bracket 172 and rotary cylinder 164 around the hinge 182 changes the lateral load experienced by the piston rod 170 during actuation relative to a fixed arrangement. In some embodiments, the lateral load on the piston rod 170 of the rotary cylinder 164 is decreased from that of a fixed connection. In some embodiments, the lifting torque available from the rotary cylinder 164 increases as the stroke (distance that the piston rod 170 extends) increases. For example, when the piston rod 170 is fully extended so that the lift assembly 120 is in the lift position (as shown in FIG. 9A), the torque available to move the lift assembly 120 is greater than when the piston rod 170 is retracted.

Figure 9D:
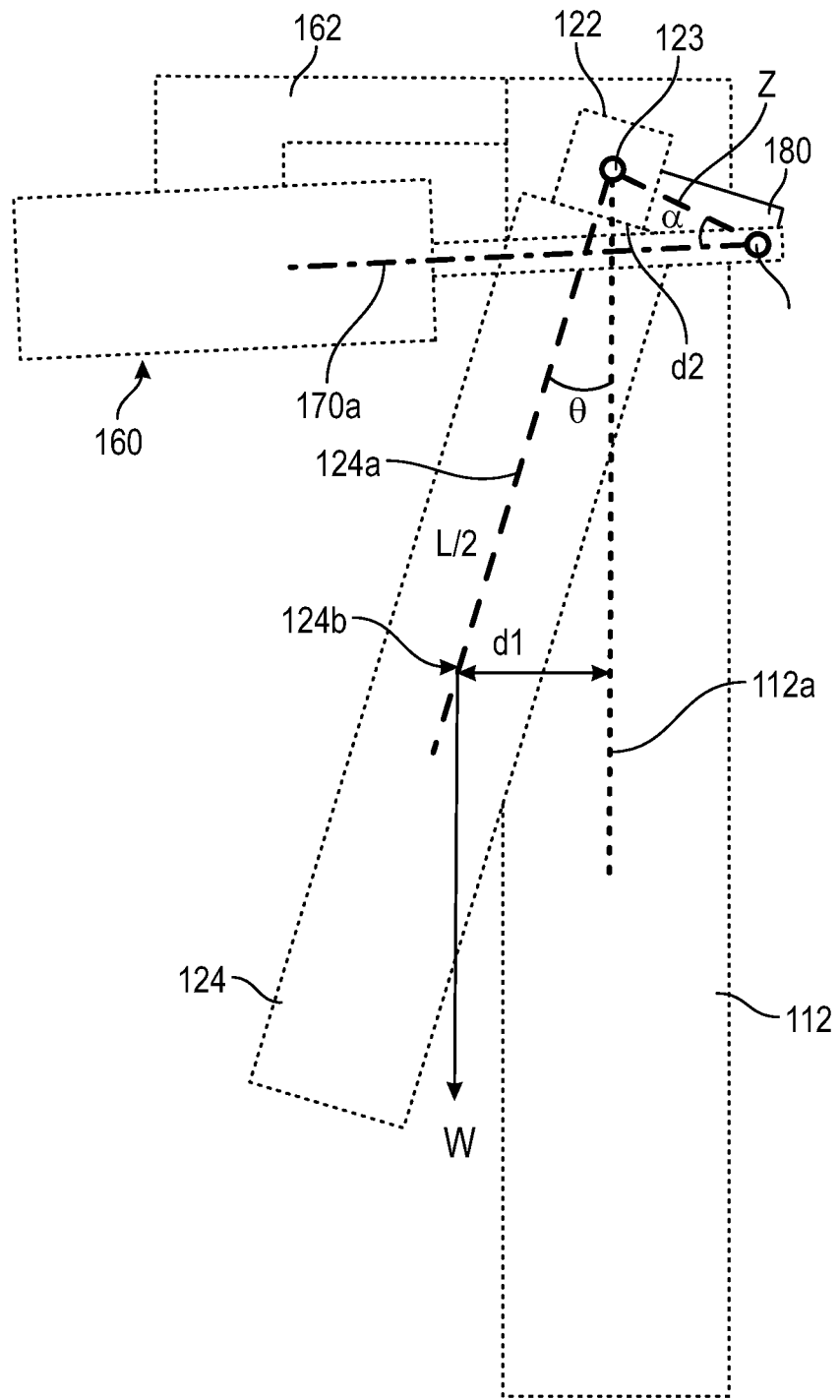
FIG. 9D is a schematic side view of a rotary cylinder and lift assembly of a load lift illustrating the angular relationships of the component axes and forces according to one or more embodiment of the disclosure.

FIG. 9D illustrates a schematic representation of the main cylinder 124 and rotary cylinder in relation to the upright 112. The upright axis 112a, main cylinder axis 124a, center line 170a of the piston rod 170 and lift beam axis 123 are illustrated. The center point 124b of the length L of the main cylinder 124 is indicated at distance L/2, one-half the length of the main cylinder. The lever arm axis 180a is indicated and extends between the lift beam axis 123 and the hinge 182 and has a length Z.

The torque required to lift a mass (i.e., the lift assembly) is a function of the force (W) and the perpendicular distance (d1) between the upright axis 112a and the center point 124b of the main cylinder 124. The angle θ is defined as the angle between the upright axis 112a and the main cylinder axis 124a. Along the movement path of the lift assembly, the torque required is equal to W×L/2×sin(θ). When in the lift position, as shown in FIG. 9A, the angle θ is zero resulting in a calculated torque requirement of zero. As the angle moves to the standby position, as shown in FIG. 9C, the required torque is at the maximum.

The torque available for moving the lift assembly between the lift position and the standby position is a function of the force to be moved times the perpendicular distance d2 between the lift beam axis 123 and the center line 170a of the piston rod 170, which is equal to W×Z×sin(α). The angle is defined as between lever arm axis 180a and the center line 170a of the piston rod axis. In the lift position, the torque required to move the lift assembly is small and as the lift assembly is moved to the standby position, the torque available increases. The movement of the floating bracket 172 during movement of the lift assembly allows for greater torque available at the initial angle.

Figure 10:
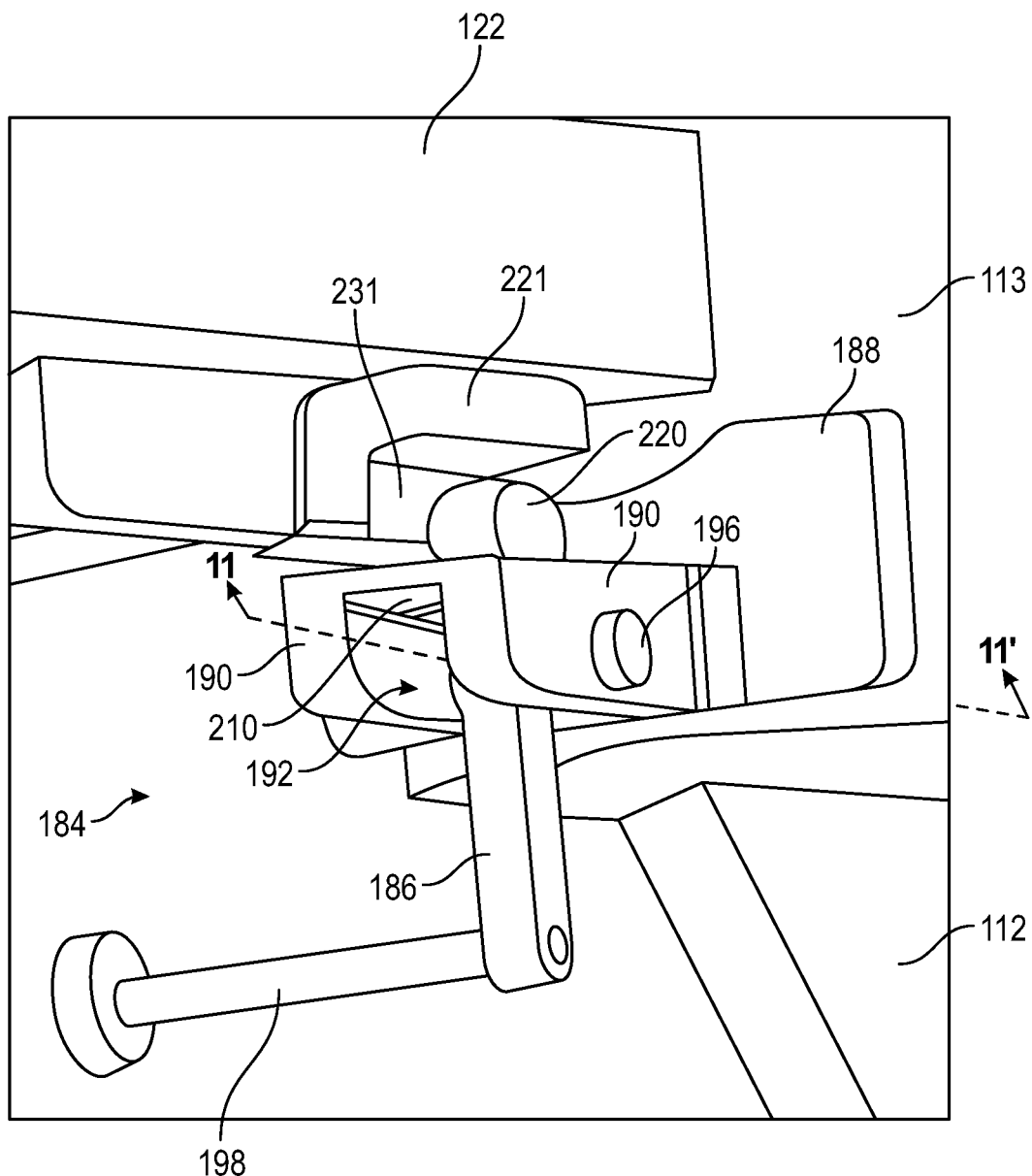
FIG. 10 is a parallel projection view of a lock assembly portion of a load lift according to one or more embodiment of the disclosure.
Figure 11A:
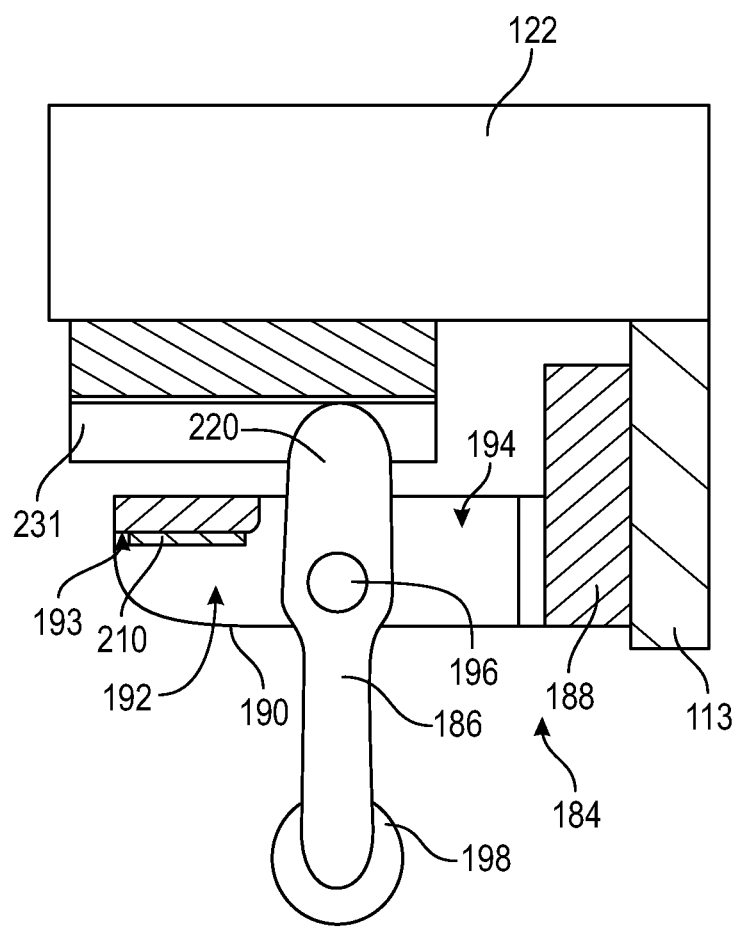
FIG. 11A is a side schematic view of a lift assembly in the standby position and the lock assembly in the locked position according to one or more embodiment of the disclosure.
Figure 11B:
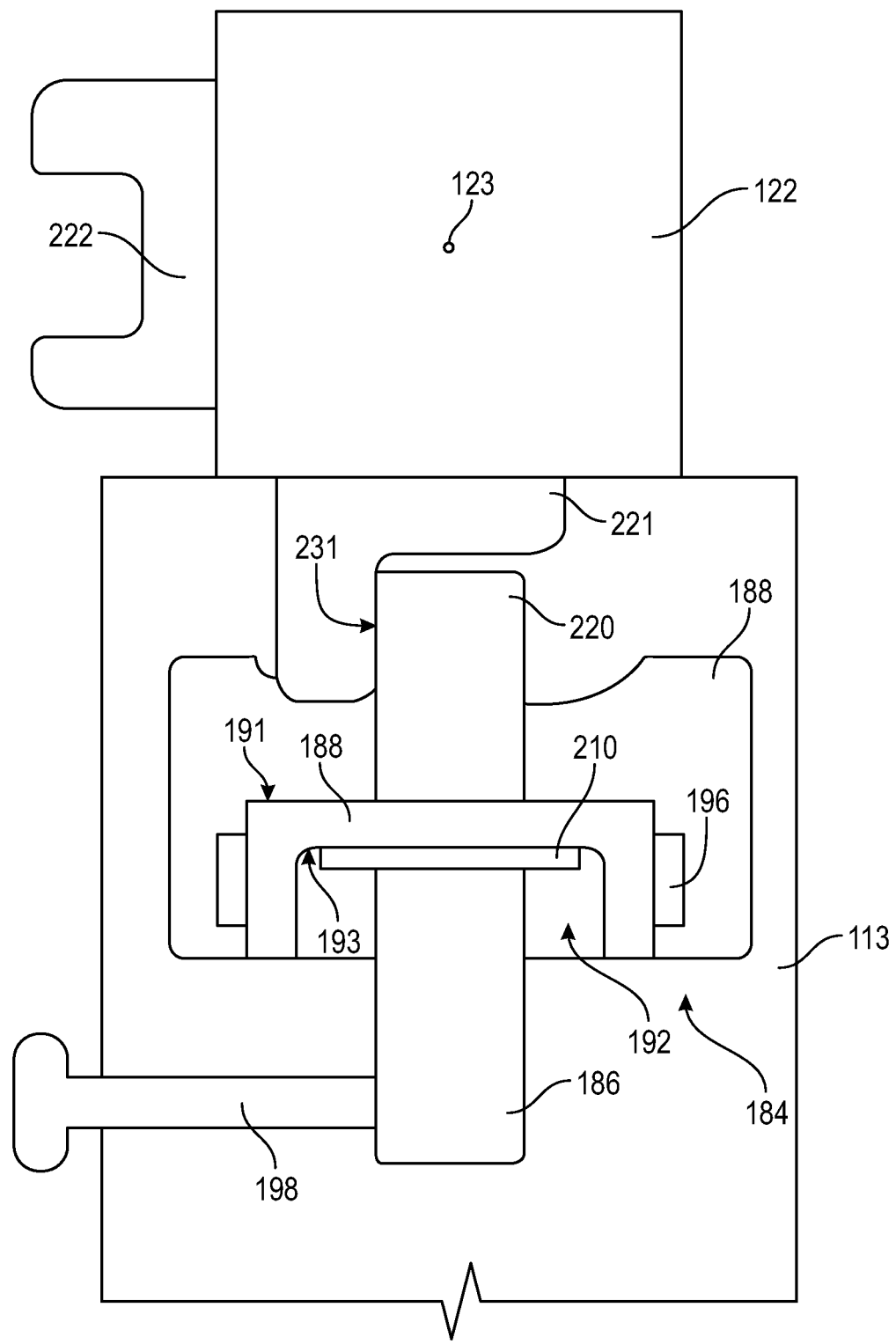
FIG. 11B is a front schematic view of the lift assembly in the standby position and the lock assembly in the locked position of FIG. 11A.
Figure 12A:
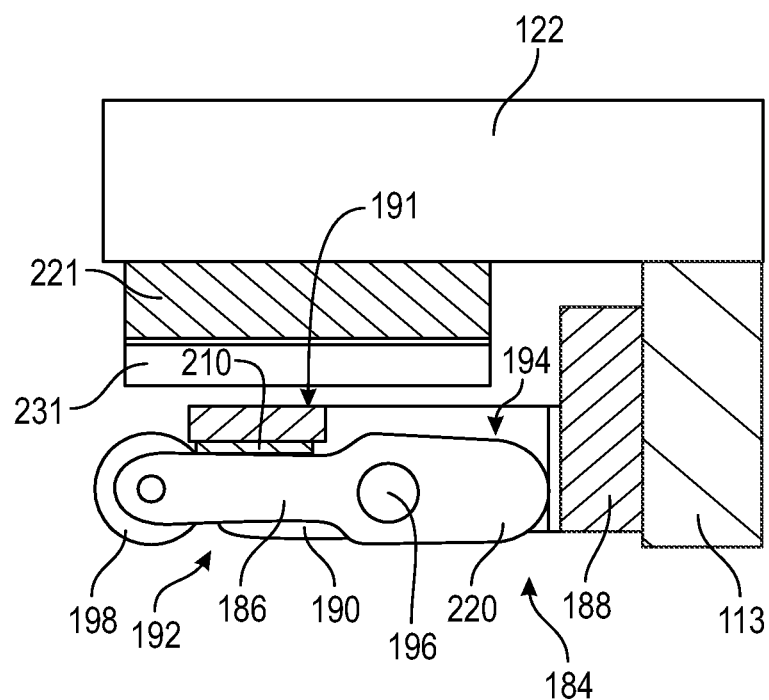
FIG. 12A is a side schematic view of a lift assembly in the standby position and the lock assembly in the unlocked positioned according to one or more embodiment of the disclosure.
Figure 12B:
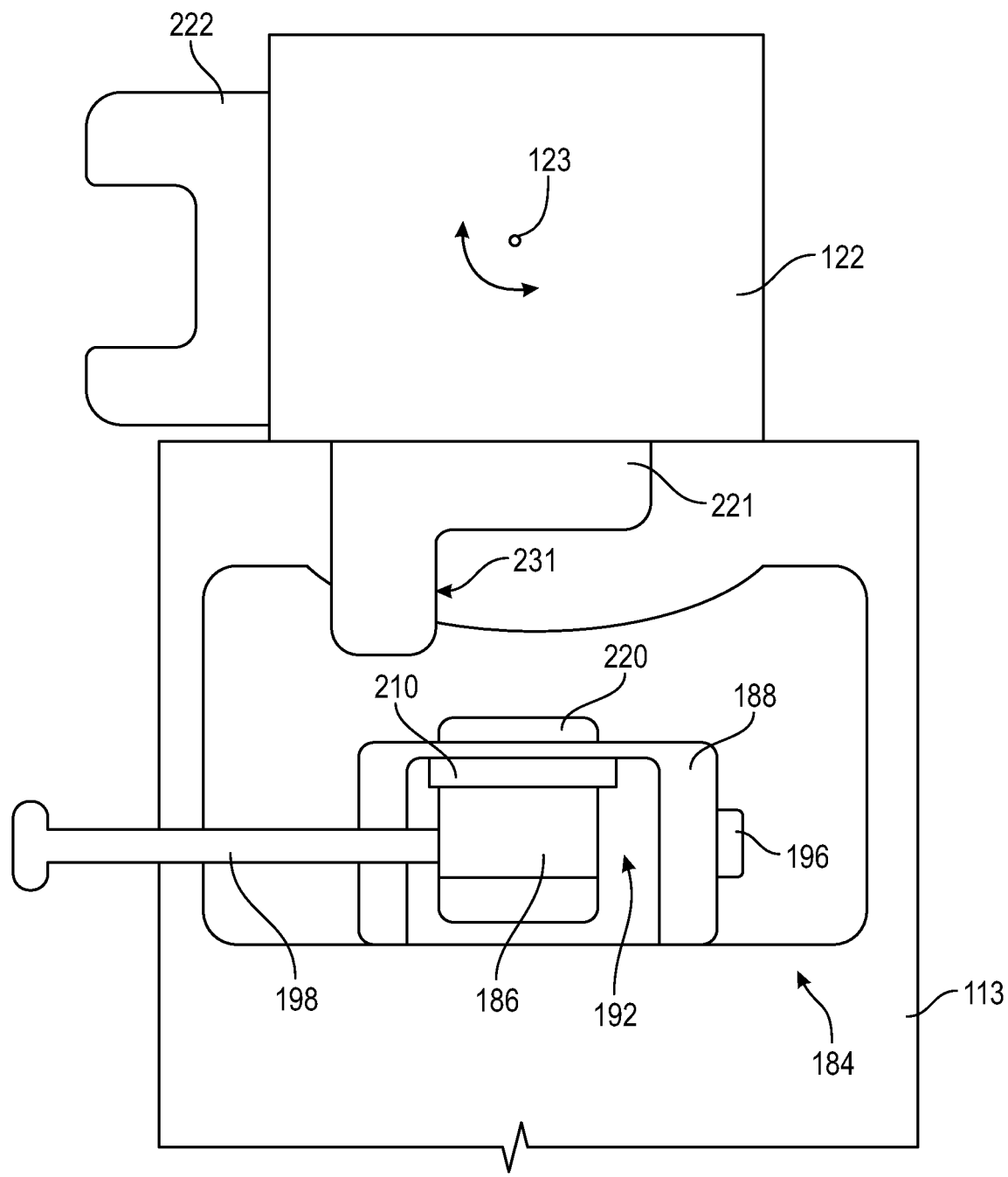
FIG. 12B is a front schematic view of the lift assembly in the standby position and the lock assembly in the locked position of FIG. 12B.
Figure 13:
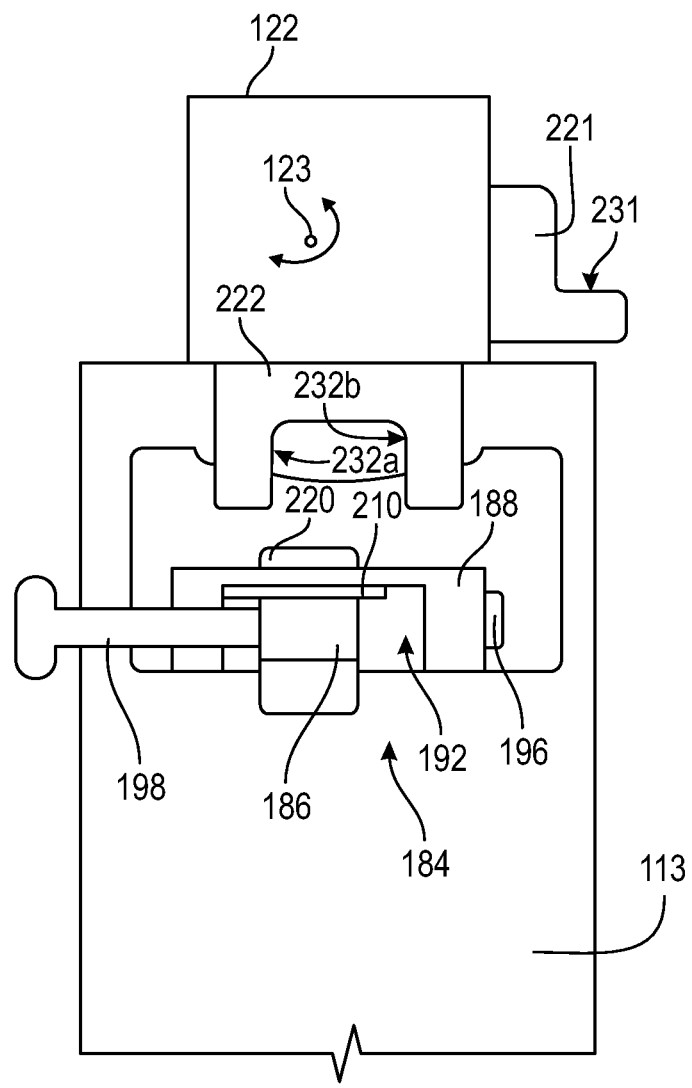
FIG. 13 is a front schematic view of a lift assembly in the lift position and the lock assembly in the unlocked position according to one or more embodiment of the disclosure.
Figure 14:
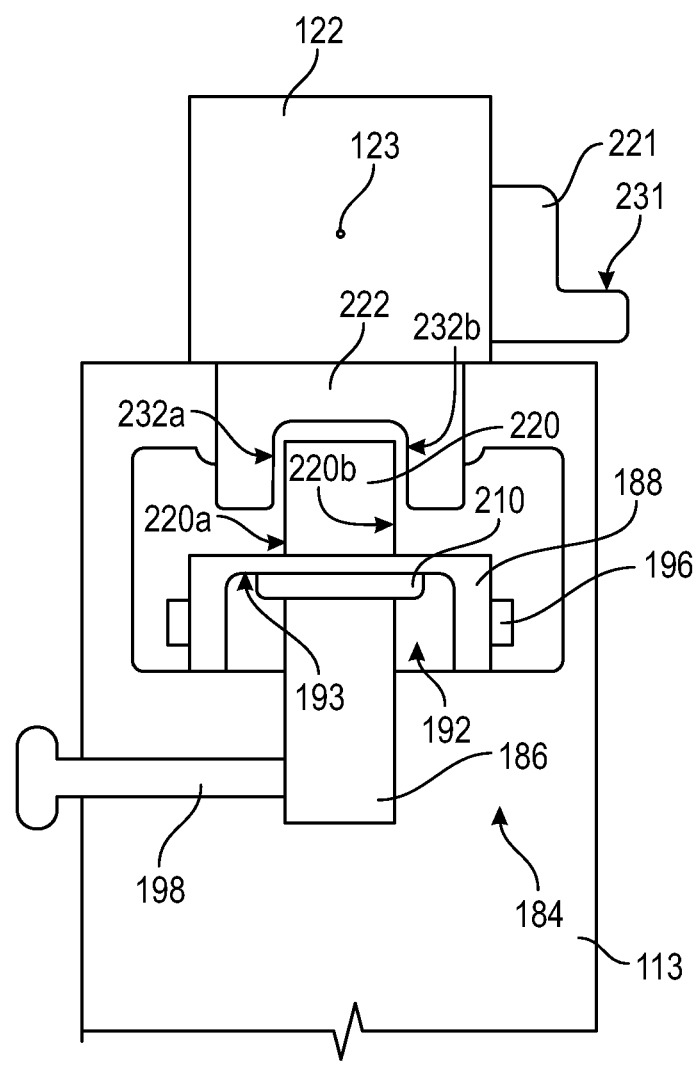
FIG. 14 is a front schematic view of a lift assembly in the lift position and the lock assembly in the locked position according to one or more embodiment of the disclosure.

To prevent inadvertent movement of the lift assembly 120 when either the lifting position or the standby position, a lock assembly 184 can be employed. FIGS. 10 through 13 illustrate a lock assembly 184 according to one or more embodiment of the disclosure. FIG. 10 shows a partial orthographic view of the lock assembly 184 in the locked standby position. FIG. 11A shows a partial cross-sectional view of the lock assembly 184 of FIG. 11 taken along line 11-11'. FIG. 11B shows a front view of the lock assembly 184 of FIG. 11A. FIG. 12A shows a partial cross-sectional view of the lock assembly 184 of in the unlocked standby position. FIG. 12B shows a front view of the lock assembly 184 of FIG. 12A. FIG. 13 shows a front view of the lock assembly 184 in the unlocked lift position, and FIG. 14 shows a front view of the lock assembly 184 in the locked lift position. The embodiment illustrated in the Figures is merely exemplary and should not be taken as limiting the scope of the disclosure.

The lock assembly 184 includes a locking lever 186 that is movable between a locked position (see FIGS. 10, 11A, 11B and 14) and an unlocked position (see FIGS. 12A, 12B and 13). In the illustrated embodiment, the locking lever 186 is connected to a lock mounting 188 with a lever support portion 190. The lever support portion 190 has an actuation region 192 in which the locking lever 186 is hingedly connected to the lock mounting 188.

In the embodiment shown, the lever support portion 190 is an upside-down U-shaped portion. The open portion of the U-shape is the actuation region 192. An opening 194 in the top 191 of the support portion 190 allows part of the lever 186 to pass through.

The locking lever 186 is connected to the lever support portion 190 using any suitable connection that allows movement of the lever. In the illustrated embodiment, the locking lever 186 is connected to the lever support portion 190 using a hinge rod 196. The hinge rod 196 of some embodiments is a rod with crimped or fittings on the ends to prevent the rod from falling out. In some embodiments, the hinge rod 196 is a smooth-shafted bolt with a suitable nut to hold the bolt in place. The hinge rod 196 acts as the fulcrum for rotation of the locking lever 186 from the locked and unlocked positions.

In some embodiments, the locking lever 186 is automatically actuated by a computer controlled system. In the illustrated embodiment, the locking lever 186 is manually actuated between the locked and unlocked positions. To assist the user in the manual operation, a handle 198 is positioned at the end of the locking lever 186.

Some embodiments include a latch to prevent the locking lever 186 from falling out of the unlocked position. In the embodiment illustrated, the latch comprises a magnet 210 affixed to the bottom side 193 of the front portion of the lever support portion 190. The latch can be any suitable component and is not limited to magnets. In some embodiments, the latch is a pin (not shown) that is positioned through an opening (not shown) in the locking lever 186 or that can be positioned below the locking lever 186.

In some embodiments, the engagement portion 220 of the locking lever 186 contacts a hard stop 221, 222 when the lift assembly 120 is in one or more of the lift position or the standby position. In some embodiments, the lock mounting 188 is affixed to the upper portion 113 of an upright 112 and the hard stop 221, 222 is positioned on the lift beam 122. In some embodiments, there are two hard stops: a standby hard stop 221 and a lift hard stop 222.

The standby hard stop 221, shown in FIGS. 10, 11A, 11B, 12A and 12B, is configured so that contact between the engagement portion 220 of the locking lever 186 and the engagement surface 231 of the standby hard stop 221 prevents the lift assembly 120 from swinging down from the standby position if power or pressure to the rotary cylinder 164 is lost. In some embodiments, as illustrated, the standby hard stop 221 has one engagement surface 231 because the standby hard stop 221 prevents the lift assembly 120 from moving in one direction.

FIGS. 11A and 11B show cross-sectional and front views of the lock assembly 184 when in the standby position. To move the lift assembly 120 from the standby position to the lift position, the locking lever 186 is moved from the locked position so that the handle 198 rotates upward toward the magnet 210. Once the handle 198 has been moved sufficiently, the locking lever 186 contacts the magnet 210 and is held in place in the unlocked position. The unlocked position is illustrated in the cross-sectional view of FIG. 12A and the front view of FIG. 12B.

Once in the unlocked position, the lift assembly 120 can be rotated around the lift beam axis 123 from the standby position to the lift position. FIG. 13 shows the lift beam 122 of the lift assembly 120 rotated into the lift position with the locking lever 186 in the unlocked position.

Once the lift assembly 120 is in the lift position, the locking lever 186 of some embodiments is rotated to disengage the locking lever 186 from the magnet 210 and rotate the engagement portion 220 to engage the lift hard stop 222, as shown in FIG. 14. The lift hard stop 222 of some embodiments has two engagement surfaces 232a, 232b which are configured to engage two surfaces 220a, 220b of the engagement portion 220 of the locking lever 186. Interactions of the engagement surfaces 220a with engagement surface 232a, and of engagement surface 220b with engagement surface 232b prevent the lift assembly 120 from moving away from the lift position in either direction so that unnecessary lateral forces on the lift assembly 120 are prevent in the event an accidental engagement or overextension of the rotary cylinder 164.

Some embodiments of the disclosure are directed to methods of moving a load. In some embodiments, the lift assembly 120 is moved to the lift position using the rotary cylinder 164. In some embodiments, the locking lever 186 is moved to the locked position to prevent accidental movement of the lift assembly 120.

Once in the lift position, the load to be moved is connected to the lift assembly 120. In some embodiments, the load is connected to the clamp plate 130 of the lift assembly 120. Once the load is connected, the main cylinder 124 and standby cylinders 126 are actuated to lift the load.

To put the load back down, the load is lowered by actuating the lift assembly 120 in the lowering direction. The load is disconnected from the lift assembly 120 or the clamp plate 130 of the lift assembly 120.

The locking lever 186 is rotated from the locked position to the unlocked position. In some embodiments, the locking lever 186 is magnetically held in place in the unlocked position to allow movement of the lift assembly 120. The rotary cylinder 164 is actuated to rotate the lift assembly 120 around the lift beam axis 123 to the standby position. The locking lever 186 is moved from the unlocked position to engage the standby hard stop 221 to prevent accidental movement of the lift assembly 120 from the standby position.

Figure 15:
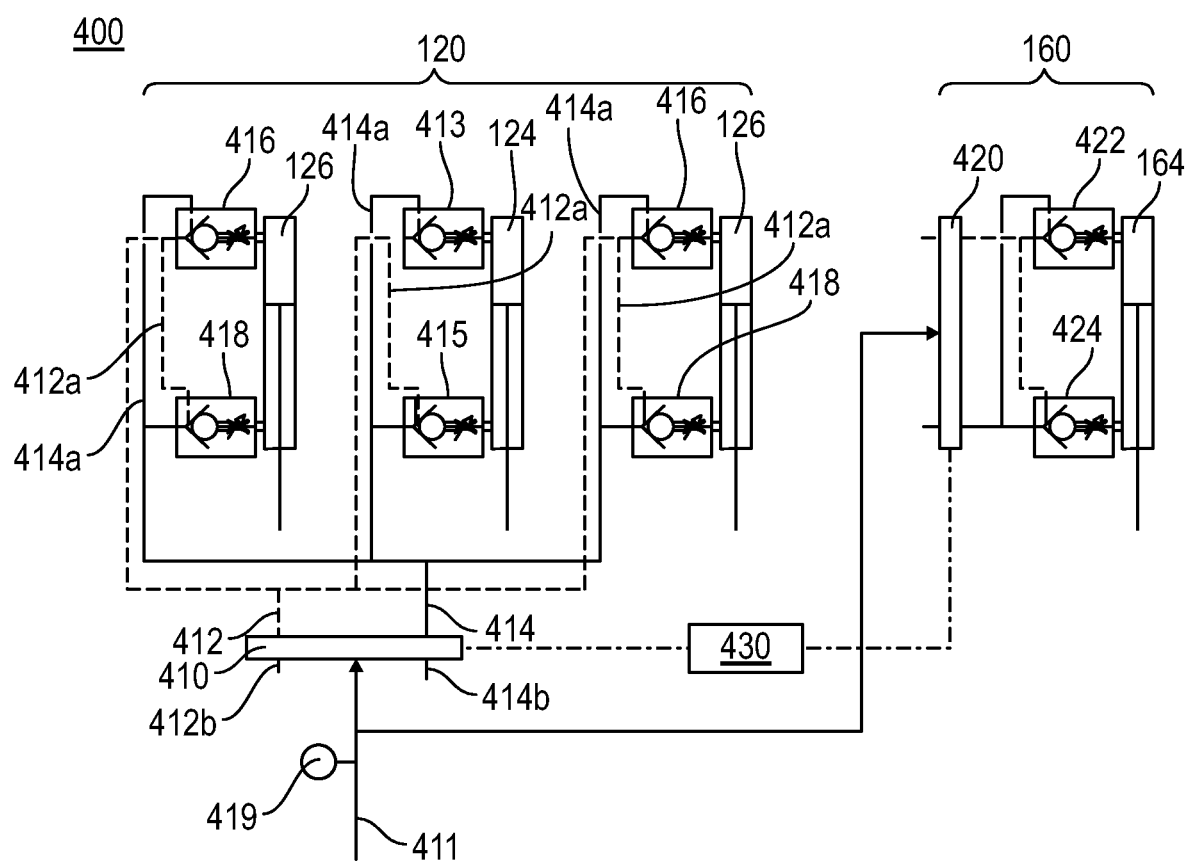
FIG. 15 is a schematic view of an advanced pneumatic control system according to one or more embodiment of the disclosure.

Referring to FIG. 15, some embodiments of the disclosure are directed to advanced pneumatic control systems 400. The advanced pneumatic control system 400 of some embodiments comprises a first valve 410 connected to the main cylinder 124 and standby cylinder(s) 126 through two fluid lines 412, 414. The two fluid lines 412, 414 are connected to the first valve 410 to provide fluid flow from the fluid source line 411 to the cylinders. The main cylinder 124 is connected to the first valve 410 through the fluid lines 412, 414 through a first check valve 413 and a second check valve 415. Each of the at least one standby cylinder 126 is connected to the first valve 410 through the fluid lines 412, 414 through a first check valve 416 and a second check valve 418.

Figure 16:
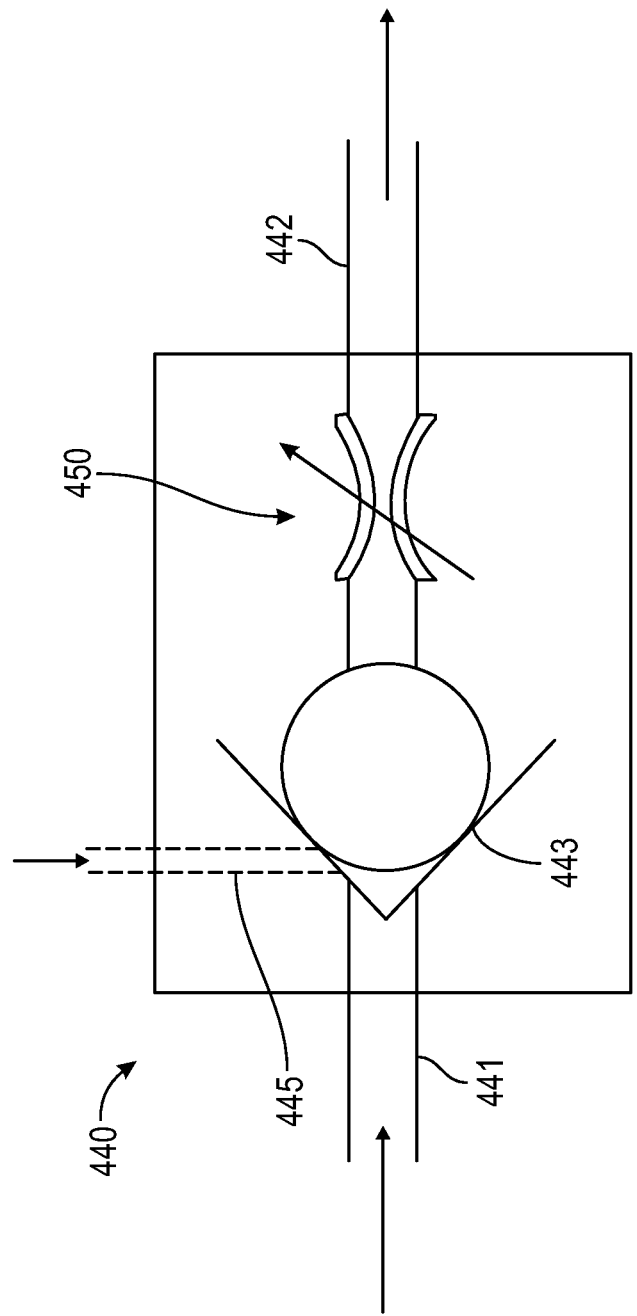
FIG. 16 is a schematic view of a pilot operated check valve with variable orifice according to one or more embodiment of the disclosure.

In some embodiments, each of the first check valves 413, 416 and the second check valves 415, 418 are pilot operated check valve. FIG. 16 shows a schematic representation of a pilot operated check valve 440 with a variable orifice 450 in accordance with one or more embodiment of the disclosure.

Under normal use, a fluid flows in the inlet 441 of the check valve and out the outlet 442 of the check valve and is prevented from flowing in the opposite direction. In the pilot operated check valve, a pilot inlet 445 allows a pilot flow to open the valve 443 to allow a reverse flow through the check valve.

In some embodiments, the pilot operated check valve 440 does not include a variable orifice. In some embodiments, a variable orifice 450 is positioned downstream of the pilot operated check valve 440. In some embodiments, the orifice is a fixed opening orifice instead of a variable orifice.

A pilot operated check valve allows the pistons of the main cylinder 124 and standby cylinders 126 to be locked into place in the event of a loss of pressure in any of the fluid lines 412, 414. Referring back to FIG. 15, a pilot operated check valve allows a flow of fluid in a first direction (shown as left to right on the drawings) from the inlet side of the check valve to the outlet side of the check valve. A branch line 412a connects the inlet line of the first check valve 413, 416 to the pilot inlet of the second check valve 415, 418. A fluid flowing into the first valve 410 is directed through the first fluid line 412. The first fluid line 412 connects to the inlet of the first check valve 413, 416 and a branch line 412a connects the inlet of the first check valve 413, 416 to the pilot inlet of the second check valve 415, 418. This arrangement allows a flow of fluid into the cylinder from the first check valve 413, 416 and out of the cylinder through the second check valve 415, 418. If pressure is lost in either of the fluid lines 412, 414, the pilot will close preventing the flow of fluid exiting the cylinder through the second check valves 415, 418.

In the reverse actuation process, the fluid is flowed through the first valve 410 and directed to the second fluid line 414. The second fluid line 414 connects to the inlet of the second check valve 415, 418 and a branch line 414a connects the inlet of the second check valve 415, 418 to the pilot inlet of the first check valve 413, 316. This arrangement allows a flow of fluid into the cylinder from the second check valve 415, 418 and out of the cylinder through the first check valve 413, 416. If pressure is lost in either of the fluid lines 412, 414, the pilot will close preventing the flow of fluid exiting the cylinder through the first check valve 413, 416.

In some embodiments, the first valve has a first line exhaust outlet 412b and a second line exhaust outlet 414b. The outlets 412b, 414b allow for release of pressure in the valve 410 should one of the lines 412, 414 lose pressure. A pressure gauge 419 is connected to the fluid source line 411 in some embodiments.

In some embodiments, the fluid source line 411 is also connected to a second valve 420. The second valve 420 of some embodiments is connected to the rotary cylinder 164 of the rotary actuator. The rotary cylinder 164 of some embodiments is connected to two pilot operated check valves 422, 424, and operated in the same manner as the valves of the lift assembly 120.

In some embodiments, a controller 430 is connected to one or more of the first valve 410 and the second valve 420. The controller 430 of some embodiments provides power to the first valve 410 and/or the second valve 420 either through electrical connection, a manual switch or through an automated or fluidic manifold. In some embodiments, the controller 430 is a manually operated switch that allows the operator to change the fluid flow between the first valve 410 and the second valve 420 to switch between lifting operations and movement to the standby position.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A load lift comprising:
    a support frame having uprights and a cross beam, the uprights extending along a first direction and connected together by the cross beam extending along a second direction; and
    a lift assembly comprising:
        a lift beam with a lift beam axis extending along the second direction, the lift beam connected to the cross beam and configured to rotate around the lift beam axis between a lift position and a standby position;
        a main cylinder with a first end and a second end, the first end connected to the lift beam;
        at least one standby cylinder with a first end a second end,
        the first end connected to the lift beam; and
            a clamp plate connected to the second end of the main cylinder and the second end of the at least one standby cylinder.

2. The load lift of claim 1, wherein there are two standby cylinders.

3. The load lift of claim 2, wherein the standby cylinders are on opposing sides of the main cylinder.

4. The load lift of claim 1, further comprising a spreader bar connected to the clamp plate, the spreader bar configured to cooperatively interact with a process chamber dome.

5. The load lift of claim 4, wherein the clamp plate has a ball joint on a side of the clamp plate opposite the main cylinder and the spreader bar is connected to the ball joint.

6. The load lift of claim 1, further comprising a rotary actuator assembly connected to the lift beam and the cross beam, the rotary actuator assembly comprising a mounting bracket connected to the cross beam, a rotary cylinder connected to the mounting bracket and the lift beam and configured so that movement of a piston rod from the rotary cylinder causes the lift beam to rotate around the lift beam axis from the standby position to the lift position.

7. The load lift of claim 6, wherein when the piston rod of the rotary cylinder is extended from the rotary cylinder, the lift beam is in the lift position and when the piston rod of the rotary cylinder is retracted, the lift beam is in the standby position.

8. The load lift of claim 7, wherein the mounting bracket is fixedly secured to the cross beam and has a hinged connection with a floating bracket holding the rotary cylinder.

9. The load lift of claim 8, wherein when the piston rod of the rotary cylinder is extended, the floating bracket rests at an angle offset from perpendicular to the lift beam axis.

10. The load lift of claim 9, wherein when the piston rod of the rotary cylinder is retracted, the floating bracket rotates around the hinged connection with the mounting bracket to rest at an angle perpendicular to the lift beam axis.

11. The load lift of claim 10, wherein lateral load on the piston rod of the rotary cylinder is decreased from a fixed connection.

12. The load lift of claim 1, further comprising a locking lever movable from between a locked position and an unlocked position.

13. The load lift of claim 12, wherein the locking lever is connected to a fixed hinge and a hard stop to allow the lift assembly to be locked in the standby position.

14. A method of moving a load, the method comprising:
    lowering the load by actuating a lift assembly having a lift beam connected to a clamp plate through a main cylinder and at least one standby cylinder, the load connected to the clamp plate;
    disconnecting the load from the clamp plate; and
    rotating the lift assembly around an axis of the lift beam to a standby position.

15. The method of claim 14, wherein there are two standby cylinders actuated with the main cylinder, the standby cylinder positioned on opposing sides of the main cylinder.

16. The method of claim 14, wherein disconnecting the load from the clamp plate further comprises disconnecting the load from a spreader bar connected to the clamp plate, the spreader bar configured to cooperatively interact with the load.

17. The method of claim 14, wherein rotating the lift assembly around the axis of the lift beam comprises actuating a rotary actuator assembly connected to the lift beam and a cross beam, the rotary actuator assembly comprising a mounting bracket connected to the cross beam, a rotary cylinder connected to the mounting bracket and the lift beam and configured so that movement of a piston rod from the rotary cylinder causes the lift beam to rotate around a lift beam axis from the standby position to the lift position.

18. The method of claim 17, wherein when the piston rod of the rotary cylinder is extended from the rotary cylinder, the lift beam is in the lift position and when the piston rod of the rotary cylinder is retracted, the lift beam is in the standby position.

19. The method of claim 18, wherein the mounting bracket is fixedly secured to the cross beam and has a hinged connection with a floating bracket holding the rotary cylinder, and when the piston rod of the rotary cylinder is retracted, the floating bracket rests at an angle offset from perpendicular to the lift beam axis, and when the piston rod of the rotary cylinder extends, the floating bracket rotates around the hinged connection with the mounting bracket to rest at an angle perpendicular to the lift beam axis.

20. A load lift comprising:
    a support frame having uprights and a cross beam, the uprights extending along a first direction and connected together by the cross beam extending along a second direction;
    a lift assembly comprising:

a lift beam with a lift beam axis extending along the second direction, the lift beam connected to the cross beam and configured to rotate around the lift beam axis between a lift position and a standby position, a main cylinder with a first end and a second end, the first end connected to the lift beam, two standby cylinders positioned on opposing sides of the main cylinder, each of the standby cylinders having a first end a second end, the first end connected to the lift beam, a clamp plate having a top surface and a bottom surface, the top surface connected to the second end of the main cylinder and the second end of the standby cylinders, the bottom surface connected to a ball joint, and a spreader bar connected to the ball joint of the clamp plate, the spreader bar configured to cooperatively interact with a process chamber dome; and, a rotary actuator assembly connected to the lift beam, the rotary actuator assembly comprising:

a mounting bracket fixedly secured to the cross beam, a floating bracket connected to the mounting bracket with a hinged connection, a rotary cylinder connected to the floating bracket and the lift beam so that a piston rod is connected to the lift beam, and configured so that movement of a piston rod from the rotary cylinder causes the lift beam to rotate around the lift beam axis from the standby position to the lift position.

* * * * *